United States Patent
Doi et al.

(10) Patent No.: US 12,217,969 B2
(45) Date of Patent: Feb. 4, 2025

(54) SILICON DRY ETCHING METHOD

(71) Applicant: ULVAC, Inc., Kanagawa (JP)

(72) Inventors: Kenta Doi, Kanagawa (JP); Toshiyuki Sakuishi, Kanagawa (JP); Toshiyuki Nakamura, Kanagawa (JP); Yasuhiro Morikawa, Kanagawa (JP)

(73) Assignee: ULVAC, Inc, Kanagawa (JP)

( * ) Notice: Subject to any disclaimer, the term of this patent is extended or adjusted under 35 U.S.C. 154(b) by 656 days.

(21) Appl. No.: 17/393,208

(22) Filed: Aug. 3, 2021

(65) Prior Publication Data
US 2022/0044938 A1    Feb. 10, 2022

(30) Foreign Application Priority Data
Aug. 5, 2020    (JP) .................................. 2020-133374

(51) Int. Cl.
*H01L 21/3065* (2006.01)
*H01J 37/32* (2006.01)
*H01L 21/308* (2006.01)

(52) U.S. Cl.
CPC .. *H01L 21/30655* (2013.01); *H01J 37/32091* (2013.01); *H01J 37/32816* (2013.01); *H01L 21/3085* (2013.01); *H01L 21/3086* (2013.01); *H01J 2237/332* (2013.01); *H01J 2237/334* (2013.01); *H01J 2237/335* (2013.01); *H01L 21/3081* (2013.01)

(58) Field of Classification Search
None
See application file for complete search history.

(56) References Cited

U.S. PATENT DOCUMENTS

| 5,501,893 | A  | 3/1996  | Laermer et al.  |
| 9,023,731 | B2 | 5/2015  | Ji et al.       |
| 9,607,834 | B2 | 3/2017  | Matsumoto et al.|
| 9,627,221 | B1 | 4/2017  | Zaitsu et al.   |
| 10,074,543| B2 | 9/2018  | Mahorowala et al.|
| 10,438,797| B2 | 10/2019 | Cottle et al.   |

(Continued)

FOREIGN PATENT DOCUMENTS

| JP | 2002033313   | 1/2002 |
| JP | 2006060089 A | 3/2006 |

(Continued)

OTHER PUBLICATIONS

Office Action from related Taiwanese Appln. No. 110128470, dated Aug. 18, 2022. English translation attached.

(Continued)

*Primary Examiner* — Michelle Mandala
(74) *Attorney, Agent, or Firm* — Grossman, Tucker, Perreault & Pfleger, PLLC

(57) ABSTRACT

A silicon dry etching method of the invention, includes: preparing a silicon substrate; forming a mask pattern having an opening on the silicon substrate; forming a deposition layer on the silicon substrate in accordance with the mask pattern while introducing a first gas; carrying out a dry etching process with respect to the silicon substrate in accordance with the mask pattern while introducing a second gas, and thereby forming a recess pattern on a surface of the silicon substrate; and carrying out an ashing process with respect to the silicon substrate while introducing a third gas.

19 Claims, 13 Drawing Sheets

(56) References Cited

U.S. PATENT DOCUMENTS

| | | | |
|---|---|---|---|
| 10,553,430 B2 | 2/2020 | St. Armour et al. | |
| 11,302,519 B2 | 4/2022 | Nemani et al. | |
| 2009/0155977 A1* | 6/2009 | Han | H01L 21/28035 |
| | | | 257/E21.546 |
| 2010/0062606 A1* | 3/2010 | Morikawa | H01L 21/3065 |
| | | | 257/E21.218 |
| 2014/0057446 A1 | 2/2014 | Yu et al. | |
| 2014/0227876 A1* | 8/2014 | Tohnoe | H01L 21/3065 |
| | | | 438/695 |
| 2015/0235844 A1* | 8/2015 | Wang | H01L 21/02274 |
| | | | 438/789 |
| 2017/0125255 A1* | 5/2017 | Kakimoto | H01L 21/31144 |
| 2018/0068852 A1 | 3/2018 | Cottle et al. | |

FOREIGN PATENT DOCUMENTS

| | | |
|---|---|---|
| JP | 2014063866 A | 4/2014 |
| JP | 2018166223 A | 10/2018 |
| JP | 2019004057 A | 1/2019 |
| KR | 1020170018817 A | 2/2017 |
| TW | 201413818 A | 4/2014 |
| TW | 201419416 A | 5/2014 |
| TW | 201705269 A | 2/2017 |
| TW | 201729279 A | 8/2017 |
| TW | 201820391 A | 6/2018 |
| TW | 201820461 A | 6/2018 |
| WO | 2011102140 A1 | 8/2011 |
| WO | 2017217132 A1 | 12/2017 |

OTHER PUBLICATIONS

Office Action from related Japanese Appln. No. 2020-133374 dated Feb. 6, 2024. English translation attached. 12 pages.

Office Action from related Korean Appln. No. 10-2021-0099982, dated Dec. 30, 2023. English translation attached. 13 pages.

Office Action from related Taiwanese Appln. No. 110128470, dated Aug. 16, 2022. English translation attached. (NPL previously submitted on Oct. 18, 2022. This information is provided to correct the date from Aug. 18, 2022 to Aug. 16, 2022.).

Office Action from related Korean Appln. No. 10-2021-0099982, dated Feb. 13, 2024. English translation attached. 13 pages.

Opposition Statement Submission Notice Received in JP Patent No. JP7478059B with a Shipping Date of Nov. 25, 2024. (19 pages) English Translation Attached.

* cited by examiner

SILICON DRY ETCHING METHOD

BACKGROUND OF THE INVENTION

Field of the Invention

The present invention relates to a silicon dry etching method. Particularly, the invention relates to a preferred technique used when a recess portion such as a trench or the like with a high-aspect ratio is formed by processing a surface of a substrate such as a silicon substrate or the like using dry etching.

This application claims priority from Japanese Patent Application No. 2020-133374 filed on Aug. 5, 2020, the contents of which are incorporated herein by reference in their entirety.

Description of Related Art

Conventionally, parts, for example, semiconductor parts used for an electronic device, parts used for micro mechanical parts, or the like are manufactured from a silicon substrate. At this time, it is known that parts are formed by anisotropic chemical corrosion (attack) using plasma such as a so-called bosch process (for example, U.S. Pat. No. 5,501,893, hereinbelow, referred to as Patent Document 1).

Furthermore, for example, Japanese Unexamined Patent Application, First Publication No. 2002-033313 (hereinbelow, referred to as Patent Document 2) discloses a purpose of minimizing RIE-lag or solving a problem due to RIE-lag when such parts with a high-aspect ratio are processed.

There is a case in which a recess portion with a high-aspect ratio such as a via hole, a trench, or the like is formed on a silicon wafer by dry etching. In this case, when recess portions are formed such that patterns having aspect ratios different from each other are mixed on the same wafer, the etching rate of the pattern having a low-aspect ratio is higher than that of the pattern having a high-aspect ratio. For this reason, there is a problem in that a difference in depth, which is referred to as an RIE-lag (Reactive Ion Etch-lag), is generated.

The "RIE-lag" is a phenomenon in which a difference in etching rate occurs depending on the size of the opening of a mask used in plasma etching. The difference in etching rate depends on the aspect ratio (a ratio of the depth of a groove to the width of the groove) of the groove (recess portion) such as a via hole, a trench, or the like.

The technique disclosed in Patent Document 1 could still not solve this problem.

Additionally, Patent Document 2 refers to the RIE-lag but does not intend to simultaneously form patterns having the recess portions with aspect ratios different from each other. Similar to the technique of Patent Document 1, the technique disclosed in Patent Document 2 could still not solve the aforementioned problem.

SUMMARY OF THE INVENTION

The invention was conceived in view of the above-described circumstances and achieves the following objects.
1. To solve generation of RIE-lag.
2. To achieve formation of a recess portion having patterns with a high-aspect ratio.
3. To achieve formation of recess portions having patterns which have opening diameters different from each other and have the same depths as each other.
4. To achieve formation of recess portions having patterns which each have a high-aspect ratio, are further deep, and have the same diameter in the depth direction in the case of forming recess portions having opening diameters different from each other.
5. To achieve further accurate control of the configuration of recess portions.

A silicon dry etching method according to an aspect of the invention includes: preparing a silicon substrate; forming a mask pattern having an opening on the silicon substrate (mask pattern-forming step); forming a deposition layer on the silicon substrate in accordance with the mask pattern while introducing a first gas (deposition step); carrying out a dry etching process with respect to the silicon substrate in accordance with the mask pattern while introducing a second gas, and thereby forming a recess pattern on a surface of the silicon substrate (dry-etching step); and carrying out an ashing process with respect to the silicon substrate while introducing a third gas (ashing step). Accordingly, the above-mentioned problem is solved.

In the silicon dry etching method according to the aspect of the invention, when the ashing process is carried out on the silicon substrate, an adhering product made of the same material as that of the deposition layer adhered to an inner edge of the opening of the mask pattern may be removed.

In the silicon dry etching method according to the aspect of the invention, the ashing process may be carried out after the dry etching process.

In the silicon dry etching method according to the aspect of the invention, a deposition process of forming the deposition layer on the silicon substrate and the dry etching process may be repetitively carried out.

In the silicon dry etching method according to the aspect of the invention, the ashing process may be carried out before the deposition process.

In the silicon dry etching method according to the aspect of the invention, the ashing process, the deposition process of forming the deposition layer, and the dry etching process may be carried out in the same chamber.

In the silicon dry etching method according to the aspect of the invention, the third gas used in the ashing process may include an oxygen gas.

In the silicon dry etching method according to the aspect of the invention, an anisotropic plasma processing having anisotropy in a direction in which the recess pattern is formed may be carried out on the surface of the silicon substrate in the ashing process.

In the silicon dry etching method according to the aspect of the invention, the mask pattern may be a mask pattern formed of a hard mask not removed by the ashing process.

In the silicon dry etching method according to the aspect of the invention, the first gas used in the deposition process of forming the deposition layer includes fluorocarbon.

In the silicon dry etching method according to the aspect of the invention, an anisotropic plasma processing having anisotropy in a direction in which the recess pattern is formed may be carried out on the surface of the silicon substrate in the deposition process of forming the deposition layer.

In the silicon dry etching method according to the aspect of the invention, the second gas used in the dry etching process may include sulfur fluoride.

In the silicon dry etching method according to the aspect of the invention, the second gas used in the dry etching process may include oxygen.

In the silicon dry etching method according to the aspect of the invention, the second gas used in the dry etching process may include silicon fluoride.

In the silicon dry etching method according to the aspect of the invention, an anisotropic plasma processing having anisotropy in a direction in which the recess pattern is formed may be carried out on the surface of the silicon substrate in the dry etching process.

In the silicon dry etching method according to the aspect of the invention, the anisotropic plasma processing may be carried out by generating inductively-coupled plasma by applying alternating voltages of frequencies different from each other for a center region and a peripheral edge region of the surface of the silicon substrate to electrodes disposed to face the silicon substrate in the anisotropic plasma processing.

In the silicon dry etching method according to the aspect of the invention, a frequency of the alternating voltage applied to the peripheral edge region of the surface of the silicon substrate may be set lower than a frequency of the alternating voltage applied to the center region of the surface of the silicon substrate in the anisotropic plasma processing.

In the silicon dry etching method according to the aspect of the invention, plasma generation power applied to the center region of the surface of the silicon substrate in the ashing process and the dry etching process may be set lower than or equal to plasma generation power applied to the center region of the surface of the silicon substrate in the deposition process of forming the deposition layer.

In the silicon dry etching method according to the aspect of the invention, plasma generation power applied to the center region of the surface of the silicon substrate may be set lower than or equal to plasma generation power applied to the peripheral edge region of the surface of the silicon substrate in the deposition process of forming the deposition layer, the ashing process, and the dry etching process.

In the silicon dry etching method according to the aspect of the invention, bias power may be applied to the silicon substrate in the ashing process and the dry etching process, and the bias power applied to the silicon substrate in the dry etching process may be set lower than or equal to the bias power applied to the silicon substrate in the ashing process.

In the silicon dry etching method according to the aspect of the invention, a pressure in an atmosphere in which the ashing process is carried out may be set higher than or equal to a pressure in an atmosphere in which the deposition process of forming the deposition layer is carried out.

In the silicon dry etching method according to the aspect of the invention, a pressure in an atmosphere in which the dry etching process is carried out may be set higher than or equal to a pressure in an atmosphere in which the deposition process of forming the deposition layer is carried out.

The silicon dry etching method according to the aspect of the invention may further include preparing a plasma-processing apparatus. The plasma-processing apparatus includes: a chamber that includes an upper lid having a center region and carries out a plasma processing with respect to a target object in an internal space capable of reducing a pressure thereof; a first electrode disposed in the chamber, the target object being to be mounted on the first electrode; a first high-frequency power source that applies a bias voltage having a first frequency $\lambda 1$ to the first electrode; a spiral shaped second electrode disposed outside the chamber, is located at an opposite side of the first electrode with respect to the upper lid, and is disposed on the center region; a spiral shaped third electrode disposed outside the chamber, is located at an opposite side of the first electrode with respect to the upper lid, and is disposed at an outer-periphery of the second electrode; a second high-frequency power source that applies an alternating voltage having a second frequency $\lambda 2$ to the second electrode; a third high-frequency power source that applies an alternating voltage having a third frequency $\lambda 3$ to the third electrode; a gas introduction device that introduces a processing gas including fluorine into an inside of the chamber; and a solid source located between the upper lid and the first electrode in the chamber, is disposed close to the upper lid than the first electrode, and is used in sputtering. When the anisotropic plasma processing is carried out, in the case in which the second frequency $\lambda 2$ and the third frequency $\lambda 3$ are in relationship of $\lambda 2 > \lambda 3$, the gas introduction device is disposed at the center region of the upper lid.

The silicon dry etching method according to the aspect of the invention includes: preparing a silicon substrate; forming a mask pattern having an opening on the silicon substrate; forming a deposition layer on the silicon substrate in accordance with the mask pattern while introducing a first gas; carrying out a dry etching process with respect to the silicon substrate in accordance with the mask pattern while introducing a second gas, and thereby forming a recess pattern on a surface of the silicon substrate; and carrying out an ashing process with respect to the silicon substrate while introducing a third gas.

Consequently, in a state in which the deposition layer adhered to the region close to the inner-periphery of the opening of the mask pattern is removed by the ashing step, it is possible to form the recess pattern on the surface of the silicon substrate by the dry-etching step. Accordingly, a tapered shape such that the width of the etched recess pattern becomes narrower with an increase in the etching depth of the recess pattern due to the deposition layer adhered to the region close to the inner-periphery of the opening of the mask pattern can be prevented from being generated.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated.

That is, the silicon dry etching method according to the aspect of the invention utilizes the etching stop effect due to the deposition layer formed by the deposition step. Because of this, it is possible to reduce a difference between the depths of the recess patterns after the recess patterns (a hole, a trench, or the like) having sizes (diameters) different from each other are formed on the silicon substrate.

In the silicon dry etching method according to the aspect of the invention, when the ashing process is carried out on the silicon substrate, an adhering product made of the same material as that of the deposition layer adhered to an inner edge of the opening of the mask pattern is removed.

Therefore, the deposition layer adhered to the region close to the inner-periphery of the opening of the mask pattern is removed. Accordingly, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated. At the same time, it is possible to carry out the above-mentioned process such that the side wall of the recess pattern inside the recess portion has a predetermined shape, for example, a shape vertical to the surface of the silicon substrate.

Additionally, in the cycle of repetitively carrying out the deposition step (deposition, formation of the deposition layer) and the dry-etching step, the ashing step is carried out after the cycle is carried out. As a result, by adding the ashing step to the above-described process cycle, it is possible to remove the deposition layer (deposition) not necessary for each cycle.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, the ashing process is carried out after the dry etching process.

Consequently, in a state in which the unnecessary deposition layer that remains on the region close to the inner-periphery of the opening of the mask pattern is removed, it is possible to form a new and necessary deposition layer on the bottom portion of the recess pattern or the like. Accordingly, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated. At the same time, it is possible to carry out the above-mentioned process such that the side wall of the recess pattern inside the recess portion has a predetermined shape, for example, a shape vertical to the surface of the silicon substrate.

Additionally, in the cycle of repetitively carrying out the deposition step (deposition, formation of the deposition layer) and the dry-etching step, the ashing step is carried out after the cycle is carried out. As a result, by adding the ashing step to the above-described process cycle, it is possible to remove the deposition layer (deposition) not necessary for each cycle.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, a deposition process of forming the deposition layer on the silicon substrate and the dry etching process are repetitively carried out.

Therefore, the dry etching is carried out in a state in which the deposition layer adhered to the region close to the inner-periphery of the opening of the mask pattern is removed. Accordingly, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated. At the same time, it is possible to carry out the above-mentioned process such that the side wall of the recess pattern inside the recess portion has a predetermined shape, for example, a shape vertical to the surface of the silicon substrate.

Additionally, in the cycle of repetitively carrying out the deposition step (deposition, formation of the deposition layer) and the dry-etching step, after the cycle is carried out, it is possible to remove the deposition layer (deposition) not necessary for each cycle by carrying out the ashing step.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, the ashing process is carried out before the deposition process.

Consequently, in a state in which the deposition layer adhered to the region close to the inner-periphery of the opening of the mask pattern is removed, it is possible to form a new and necessary deposition layer on the bottom portion of the recess pattern or the like. In this state, the dry-etching step is carried out. Accordingly, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated. At the same time, it is possible to carry out the above-mentioned process such that the side wall of the recess pattern has a predetermined shape, for example, a shape vertical to the surface of the silicon substrate.

Additionally, in the cycle of repetitively carrying out the deposition step (deposition, formation of the deposition layer) and the dry-etching step, by carrying out the ashing step after the cycle is carried out, it is possible to remove the deposition layer (deposition) not necessary for each cycle.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, the ashing process, a deposition process of forming the deposition layer, and the dry etching process are carried out in the same chamber.

Therefore, the dry etching can be carried out as an in-situ process in a state in which the deposition layer adhered to the region close to the inner-periphery of the opening of the mask pattern is removed. Accordingly, since superfluous processes are not necessary, while reducing an effect of interference with respect to the processes to be minimum, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated. At the same time, it is possible to carry out the above-mentioned process such that the side wall of the recess pattern inside the recess portion has a predetermined shape, for example, a shape vertical to the surface of the silicon substrate.

Additionally, in the cycle of repetitively carrying out the deposition step (deposition, formation of the deposition layer) and the dry-etching step, after the cycle is carried out, it is possible to remove the deposition layer (deposition) not necessary for each cycle by carrying out the ashing step.

Moreover, there is a case in which thicknesses of the deposition layer formed on the bottom portions of the recess patterns vary depending on the diameters of the opening patterns. Specifically, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, the third gas used in the ashing process includes an oxygen gas.

Consequently, it is possible to carry out the ashing while maintaining a state in which the side wall is protected by forming an oxide layer on the side wall of the recess pattern in the dry-etching step. Therefore, the dry etching is carried out in a state in which the deposition layer adhered to the region close to the inner-periphery of the opening of the mask pattern is removed. Accordingly, it is possible to carry out the above-mentioned process such that the side wall of the recess pattern inside the recess portion has a predetermined shape, for example, a shape vertical to the surface of the silicon substrate, while reducing an effect due to the etching with respect to the side wall of the recess pattern. At the same time, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated. At the same time, an increase in the width of the etched recess pattern with an increase in the etching depth of the recess pattern can be prevented, or it is possible to prevent the recess pattern from being a shape not vertical to the surface of the substrate.

Furthermore, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller while reducing an effect due to the etching with respect to the side wall of the recess pattern. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, an anisotropic plasma processing having anisotropy in a direction in which the recess pattern is formed is carried out on the surface of the silicon substrate in the ashing process.

Consequently, it is possible to carry out the ashing in the case in which an effect due to the etching with respect to the side wall of the recess pattern in the dry-etching step is reduced. Therefore, the dry etching is carried out in a state in which the deposition layer adhered to the region close to the inner-periphery of the opening of the mask pattern is removed. Accordingly, it is possible to carry out the above-mentioned process such that the side wall of the recess pattern has a predetermined shape, for example, a shape vertical to the surface of the silicon substrate, while reducing an effect due to the etching with respect to the side wall of the recess pattern. At the same time, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated.

Furthermore, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller while reducing an effect due to the etching with respect to the side wall of the recess pattern. Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, the mask pattern is a mask pattern formed of a hard mask not removed by the ashing process.

Consequently, an effect on the shape of the recess pattern due to the ashing step is reduced, and the thickness of the deposition layer adhered to the bottom portion in the deposition step, which is the process after the ashing step is carried out, can be a predetermined value. Even in the case of simultaneously forming the opening patterns having diameters different from each other, the depths of the recess patterns become equal to each other, and it is possible to prevent the RIE-lag from being generated.

Moreover, since the state in which the formation region (formation range) of the recess pattern in the dry-etching step does not change is maintained, it is possible to carry out the above-mentioned process such that the side wall of the recess pattern has a predetermined shape, for example, a shape vertical to the surface of the silicon substrate. Therefore, even in the case of simultaneously forming the opening patterns having diameters different from each other, the above-mentioned process such that the side wall of the recess pattern has a predetermined shape, for example, a shape vertical to the surface of the silicon substrate is carried out, and it is possible to simultaneously prevent the RIE-lag from being generated.

In the silicon dry etching method according to the aspect of the invention, the first gas used in the deposition process of forming the deposition layer includes fluorocarbon.

Consequently, it is possible to carry out the dry-etching step in a state in which the deposition layer adhered to the region close to the inner-periphery of the opening of the mask pattern is removed by the ashing step. Therefore, there is a case in which the deposition layers are formed in the deposition step at the same time such that the thickness of the deposition layer adhered to the bottom of the recess pattern having a large opening pattern becomes larger and the thickness of the deposition layer adhered to the bottom of the recess pattern having a small opening pattern becomes smaller Even in the case of simultaneously forming the opening patterns having diameters different from each other described above, the depths of the recess patterns become equal to each other, and it is possible to prevent the RIE-lag from being generated.

In the silicon dry etching method according to the aspect of the invention, an anisotropic plasma processing having anisotropy in a direction in which the recess pattern is formed is carried out on the surface of the silicon substrate in the deposition process of forming the deposition layer.

Consequently, it is possible to form the deposition layer on the bottom portion of the recess pattern in a state in which the deposition layer is suppressed from being formed on the side wall of the recess pattern in the deposition step. Accordingly, it is possible to carry out the above-mentioned process such that the side wall of the recess pattern has a predetermined shape, for example, a shape vertical to the surface of the silicon substrate while reducing an effect due to the etching with respect to the side wall of the recess pattern.

At the same time, there is a case in which the deposition layers are formed in the deposition step at the same time while reducing an effect due to the etching with respect to the side wall of the recess pattern such that the thickness of the deposition layer adhered to the bottom of the recess pattern having a large opening pattern becomes larger and the thickness of the deposition layer adhered to the bottom of the recess pattern having a small opening pattern becomes smaller Even in the case of simultaneously forming the opening patterns having diameters different from each other described above, a tapered shape such that the width of the etched recess pattern becomes narrower with an increase in the etching depth of the recess pattern can be prevented from being generated, the depths of the recess patterns become equal to each other, and it is possible to prevent the RIE-lag from being generated.

In the silicon dry etching method according to the aspect of the invention, the second gas used in the dry etching process includes sulfur fluoride.

Because of this, fluorine radicals are generated from a fluorine compound in plasma in the dry-etching step. The fluorine radicals include chemically-active neutral radicals and ions having energy which are simultaneously generated in the plasma. The above-described fluorine radicals have significant directionality, the fluorine radicals are incident to the surface of the silicon substrate in the direction perpendicular to the surface, and therefore anisotropic plasma etching is carried out. At this time, significant impact due to the ions is applied to the bottom portion of the recess pattern. On the other hand, an impact is applied to the side wall of the recess pattern with an intensity relatively smaller than the case in which the impact is applied to the bottom portion of the recess pattern. Accordingly, the side wall is selectively protected from the etching, and the etching is limitedly carried out to the bottom portion of the recess pattern, that is, the bottom portion of the recess configuration. Accordingly, it is possible to carry out the above-mentioned process such that the side wall of the recess pattern has a predetermined shape, for example, a shape vertical to the surface of the silicon substrate.

In the silicon dry etching method according to the aspect of the invention, the second gas used in the dry etching process includes oxygen.

Because of this, oxygen radicals are used in the dry-etching step as well as fluorine radicals being used in the plasma etching. The radicals cause silicon that forms a surface of the side wall inside the recess portion to be converted into silicon oxide or silicon nitride. Consequently, an oxide film serving as a passivation layer is formed on the side wall of the recess pattern, and it is possible to form the passivation coating on the side wall. In such etching, the etching mainly proceeds on the bottom portion of the recess portion, and it is possible to maintain a state in which the side wall of the recess portion is relatively protected.

In the silicon dry etching method according to the aspect of the invention, the second gas used in the dry etching process includes silicon fluoride.

Because of this, when the etching gas is decomposed, the silicon fluoride becomes a compound that provides a silicon component of the passivation layer which serves as a secondary reactant. A mixture including a reactive product of silicon is deposited on the side wall of the recess pattern. A silicon compound that serves as a passivation layer and has resistance to etching is deposited on the side wall of the recess pattern, and it is possible to protect the side wall.

In the silicon dry etching method according to the aspect of the invention, an anisotropic plasma processing having anisotropy in a direction in which the recess pattern is formed is carried out on the surface of the silicon substrate in the dry etching process.

Consequently, the anisotropic plasma etching is carried out in the dry-etching step in a state in which the deposition layer is suppressed from being formed on the side wall of the recess pattern. Therefore, both the deposition layer formed on the bottom portion of the recess pattern and the bottom portion of the recess pattern can be removed while suppressing the etching with respect to the side wall of the recess pattern. As a result, it is possible to carry out the above-mentioned process such that the side wall of the recess pattern has a predetermined shape, for example, a shape vertical to the surface of the silicon substrate, while reducing an effect due to the etching with respect to the side wall of the recess pattern.

There is a case in which the deposition layers are formed such that the etching depth (etching amount) with respect to silicon on the bottom portion of the recess pattern having a large opening pattern and the etching depth (etching amount) with respect to silicon on the bottom portion of the recess pattern having a small opening pattern are the same as each other while reducing an effect due to the etching with respect to the side wall of the recess pattern. Even in the case of simultaneously forming the opening patterns having diameters different from each other described above, a tapered shape such that the width of the etched recess pattern becomes narrower with an increase in the etching depth of the recess pattern can be prevented from being generated, the depths of the recess patterns become equal to each other, and it is possible to prevent the RIE-lag from being generated.

In the silicon dry etching method according to the aspect of the invention, the anisotropic plasma processing is carried out by generating inductively-coupled plasma by applying alternating voltages of frequencies different from each other for a center region and a peripheral edge region of the surface of the silicon substrate to electrodes disposed to face the silicon substrate in the anisotropic plasma processing.

Consequently, it is possible to carry out the anisotropic plasma processing having anisotropy in the direction in which the recess pattern is formed on the surface of the silicon substrate.

Therefore, it is possible to form the deposition layer on the bottom portion of the recess pattern in a state of suppressing the deposition layer from being formed on the side wall of the recess pattern in the deposition step. Accordingly, it is possible to carry out the above-mentioned process such that the side wall of the recess pattern has a predetermined shape, for example, a shape vertical to the surface of the silicon substrate while reducing an effect due to the etching with respect to the side wall of the recess pattern.

Furthermore, it is possible to carry out anisotropic plasma etching with extremely high anisotropy in the dry-etching step, and the shape of the side wall of the recess pattern formed on the silicon substrate is maintained to be a substantially straight shape in the depth direction of the recess pattern. Thus, the shape of the recess pattern (a hole, a trench, or the like) obtained by the etching is a vertical shape (straight shape), and the recess pattern having the vertical shape can be stably formed without depending on the position in the radial direction of the silicon substrate in the direction along the surface of the silicon substrate. This means that, on the outer-periphery of the silicon substrate as well as the center region of the silicon substrate, the shape of the recess pattern (a hole, a trench, or the like) obtained by the etching is a vertical shape (straight shape), and the recess pattern having the vertical shape can be stably formed.

Furthermore, in the ashing step, it is possible to carry out the ashing in a state of reducing an effect due to the etching with respect to the side wall of the recess pattern in the dry-etching step. Therefore, the dry etching is carried out in a state in which the deposition layer adhered to the region close to the inner-periphery of the opening of the mask pattern is removed. Accordingly, it is possible to carry out the above-mentioned process such that the side wall of the recess pattern has a predetermined shape, for example, a shape vertical to the surface of the silicon substrate, while reducing an effect due to the etching with respect to the side wall of the recess pattern. At the same time, it is possible to form the bottom portion of the recess pattern such that the diameter of the recess portion is uniform in the direction of the etching depth without depending on the etching depth of the recess pattern. A tapered shape such that the width of the etched recess pattern becomes narrower with an increase in the etching depth of the recess pattern can be prevented from being generated.

As a result, by repeating the deposition step, the dry-etching step, and the ashing step which are described above, it is possible to form the recess patterns on the entire surface of the silicon substrate such that the shapes of the recess patterns obtained by the etching are vertical to the surface of the substrate without depending on the substrate size or the substrate shape.

At the same time, in a state in which an oxide film serving as a passivation layer is formed on the side wall of the recess pattern and the side wall is thereby passivated, it is possible to carry out anisotropic plasma etching with extremely high anisotropy in the dry-etching step. It is possible to maintain the shape of the side wall of the recess pattern formed on the silicon substrate to be a substantially straight shape in the depth direction of the recess pattern.

In the silicon dry etching method according to the aspect of the invention, a frequency of the alternating voltage applied to the peripheral edge region of the surface of the silicon substrate is set lower than a frequency of the alternating voltage applied to the center region of the surface of the silicon substrate in the anisotropic plasma processing.

Accordingly, as described above, inductively-coupled plasma with high anisotropy in the direction in which the recess pattern is formed on the surface of the silicon substrate is generated, and it is possible to carry out the anisotropic plasma processing.

In the silicon dry etching method according to the aspect of the invention, plasma generation power applied to the center region of the surface of the silicon substrate in the ashing process and the dry etching process is set lower than or equal to plasma generation power applied to the center region of the surface of the silicon substrate in the deposition process of forming the deposition layer.

Accordingly, as described above, inductively-coupled plasma with high anisotropy in the direction in which the recess pattern is formed on the surface of the silicon substrate is generated, and it is possible to carry out the anisotropic plasma processing.

Furthermore, in the deposition step, since a degree of ionization of the first gas is changed by controlling the plasma generation power applied to the center region of the surface of the silicon substrate and the plasma generation power applied to the peripheral edge region of the surface of the silicon substrate, it is possible to change the coverage of the deposition layer.

In the silicon dry etching method according to the aspect of the invention, plasma generation power applied to the center region of the surface of the silicon substrate is set lower than or equal to plasma generation power applied to the peripheral edge region of the surface of the silicon substrate in the deposition process of forming the deposition layer, the ashing process, and the dry etching process.

Accordingly, as described above, inductively-coupled plasma with high anisotropy in the direction in which the recess pattern is formed on the surface of the silicon substrate is generated, and it is possible to carry out the anisotropic plasma processing.

Moreover, in the ashing step, the ashing rate increases by setting the plasma generation power applied to the center region of the surface of the silicon substrate to be the same as the plasma generation power applied to the peripheral edge region of the surface of the silicon substrate, and a length of time for removing the deposition layer adhered to the region close to the inner-periphery of the opening of the mask pattern can be shortened.

In the silicon dry etching method according to the aspect of the invention, bias power is applied to the silicon substrate in the ashing process and the dry etching process, and the bias power applied to the silicon substrate in the dry etching process is set lower than or equal to the bias power applied to the silicon substrate in the ashing process.

Accordingly, as described above, inductively-coupled plasma with high anisotropy in the direction in which the recess pattern is formed on the surface of the silicon substrate is generated, and it is possible to carry out the anisotropic plasma processing.

Additionally, in the dry-etching step, it is possible to prevent the RIE-lag from being generated by setting the bias power applied to the silicon substrate to be lower than the bias power applied to the silicon substrate in the ashing step.

In the processing of the invention, the RIE-lag has a tendency to increase with an increase in bias power in the etching step. Because of this, as the value of the bias power is set to be low in a limited range in which the etching can be carried out, it is possible to further reduce the RIE-lag. On the other hand, in the ashing step, it is possible to increase the ashing rate by increasing the bias power.

In the silicon dry etching method according to the aspect of the invention, a pressure in an atmosphere in which the ashing process is carried out is set higher than or equal to a pressure in an atmosphere in which the deposition process of forming the deposition layer is carried out.

Accordingly, as described above, inductively-coupled plasma with high anisotropy in the direction in which the recess pattern is formed on the surface of the silicon substrate is generated, and it is possible to carry out the anisotropic plasma processing.

Furthermore, in the ashing step, it is possible to increase the ashing rate by setting the pressure in the atmosphere in which the ashing process is carried out to be higher than the pressure in the atmosphere in which the deposition step is carried out.

Here, the pressure can be controlled in accordance with the shape of the recess portion in order to control or optimize the coverage in the deposition step. On the other hand, in the ashing step, the pressure can be set in a relatively high pressure range in order to increase the ashing rate.

In the silicon dry etching method according to the aspect of the invention, a pressure in an atmosphere in which the dry etching process is carried out is set higher than or equal to a pressure in an atmosphere in which the deposition process of forming the deposition layer is carried out.

Accordingly, as described above, inductively-coupled plasma with high anisotropy in the direction in which the recess pattern is formed on the surface of the silicon substrate is generated, and it is possible to carry out the anisotropic plasma processing.

Here, the pressure at which the dry-etching step is carried out can be set in a relatively high pressure range in order to increase the etching rate.

The silicon dry etching method according to the aspect of the invention further includes preparing a plasma-processing apparatus. The plasma-processing apparatus includes: a chamber that includes an upper lid having a center region and carries out a plasma processing with respect to a target object in an internal space capable of reducing a pressure thereof; a first electrode disposed in the chamber, the target object being to be mounted on the first electrode; a first high-frequency power source that applies a bias voltage having a first frequency $\lambda 1$ to the first electrode; a spiral shaped second electrode disposed outside the chamber, is located at an opposite side of the first electrode with respect to the upper lid, and is disposed on the center region; a spiral shaped third electrode disposed outside the chamber, is located at an opposite side of the first electrode with respect to the upper lid, and is disposed at an outer-periphery of the second electrode; a second high-frequency power source that applies an alternating voltage having a second frequency $\lambda 2$ to the second electrode; a third high-frequency power source that applies an alternating voltage having a third frequency $\lambda 3$ to the third electrode; a gas introduction device that introduces a processing gas including fluorine into an inside of the chamber; and a solid source located between the upper lid and the first electrode in the chamber, is disposed close to the upper lid than the first electrode, and is used in sputtering. When the anisotropic plasma processing is carried out, in the case in which the second frequency $\lambda 2$ and the third frequency $\lambda 3$ are in relationship of $\lambda 2 > \lambda 3$, the gas introduction device is disposed at the center region of the upper lid.

With this configuration, the solid source located between the upper lid and the first electrode and is used in sputtering is disposed in the chamber. Consequently, for example, an oxygen element that becomes insufficient in plasma is sequentially introduced into the plasma from the solid source. For this reason, the oxygen element is uniformly supplied to the silicon substrate serving as a target object in the radial direction of the substrate.

Accordingly, as described above, inductively-coupled plasma with high anisotropy in the direction in which the recess pattern is formed on the surface of the silicon substrate is generated, and it is possible to carry out the anisotropic plasma processing. Therefore, the shape of the side wall of the recess pattern formed on the silicon substrate is maintained to be a substantially straight shape in the depth direction of the recess pattern. Thus, the shape of the recess pattern (a hole, a trench, or the like) obtained by the etching is a vertical shape (straight shape), and the recess pattern having the vertical shape can be stably formed on the outer-periphery of the silicon substrate as well as the center region of the silicon substrate, that is, without depending on the position in the radial direction of the silicon substrate in the direction along the surface of the silicon substrate.

As a result, it is possible to form recess patterns on the entire processing surface of the silicon substrate such that the shapes of the recess patterns obtained by the etching are vertical to the surface of the substrate without depending on the substrate size or the substrate shape.

Effects of the Invention

According to the aspect of the invention, the following effects are obtained.

It is possible to suppress RIE-lag from being generated. It is possible to form recess portions having patterns with a high-aspect ratio and with a high degree of accuracy. It is possible to prevent the shape of the recess portion formed on the silicon substrate by etching from being a tapered shape. It is possible to form the recess patterns (recessed shape such as a hole, a trench, or the like) having sizes different from each other while maintaining the side wall of the recess portion to be a shape vertical to the surface of the silicon substrate. It is possible to reduce a difference between depths of the recess patterns after the etching treatment is carried out. As a result, according to the aspect of the invention, a difference between the depths of the recess patterns (a hole, a trench, or the like) having sizes different from each other is suppressed from being generated after the etching treatment is carried out, and it is possible to form the recess portions on the surface of the silicon substrate.

DETAILED DESCRIPTION OF THE INVENTION

Hereinafter, a silicon dry etching method according to a first embodiment of the invention will be described with reference to the drawings.

Figure 1:
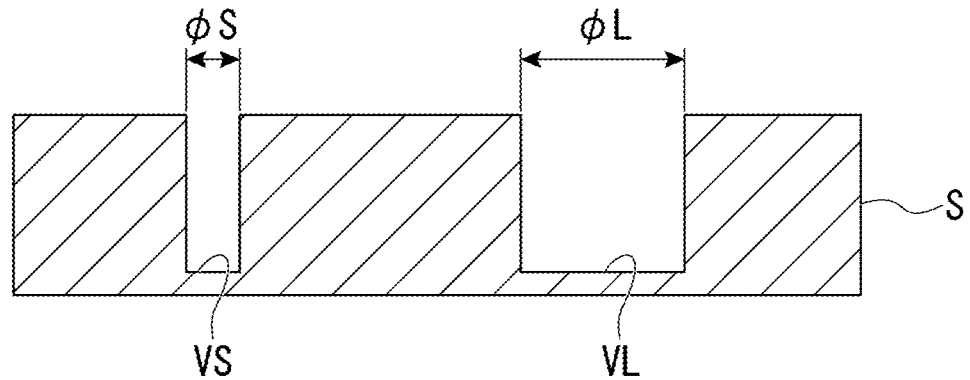
FIG. 1 is a schematic cross-sectional view showing a silicon substrate manufactured by a silicon dry etching method according to a first embodiment of the invention.
Figure 2:
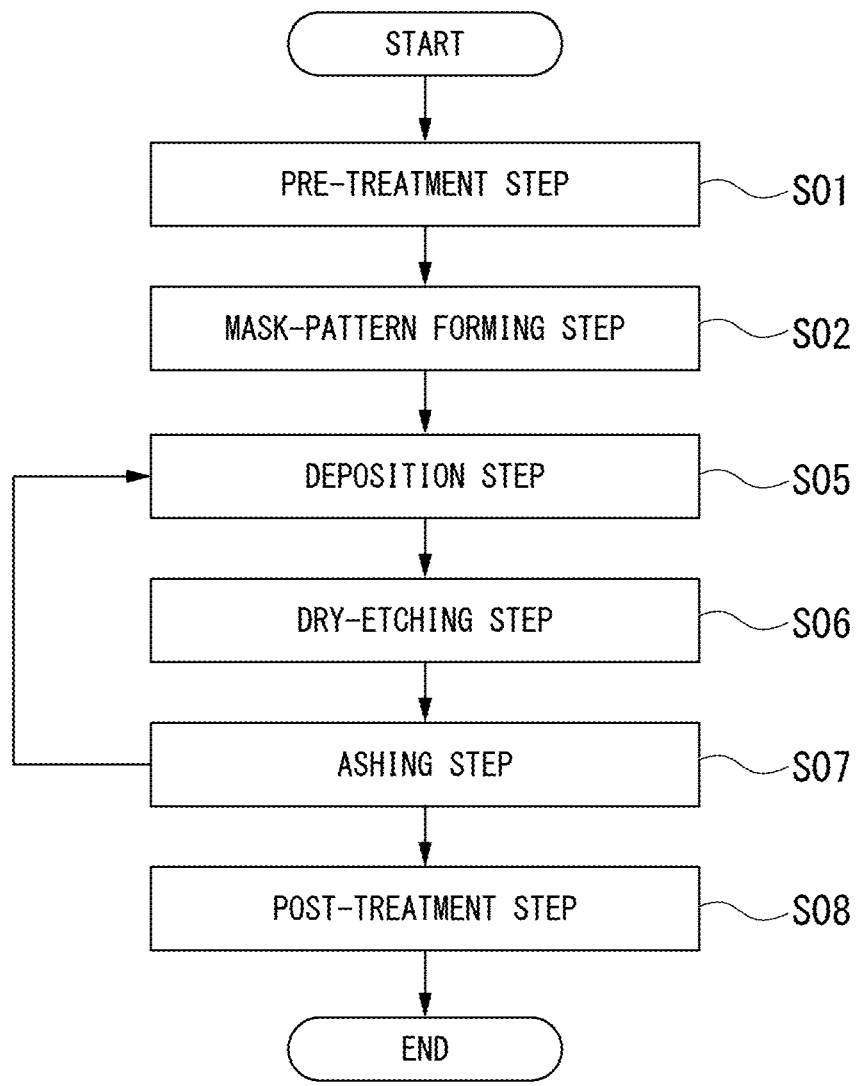
FIG. 2 is a flowchart showing the silicon dry etching method according to the first embodiment of the invention.

FIG. 1 is a schematic cross-sectional view showing a silicon substrate manufactured by a silicon dry etching method according to the embodiment. FIG. 2 is a flowchart showing the silicon dry etching method according to the embodiment. In FIG. 1, reference letter S is a silicon substrate.

As shown in FIG. 1, a recess pattern VS and a recess pattern VL are formed on a surface of a silicon substrate S by the silicon dry etching method according to the embodiment.

The recess pattern VS has a diameter (size) of $\varphi S$. The recess pattern VL has a diameter (size) of $\varphi L$. The diameter $\varphi L$ is set larger than the diameter $\varphi S$.

The depth of the recess pattern VS is the same as the depth of the recess pattern VL.

The recess pattern VS and the recess pattern VL are formed in a shape with a high-aspect ratio, for example, in a range of approximately 4 to 8, more preferably in a range of approximately 8 to 14.

Note that, the recess pattern VS and the recess pattern VL may penetrate through the silicon substrate S.

As shown in FIG. 2, the silicon dry etching method according to the embodiment includes a pre-treatment step S01, a mask-pattern forming step S02, a deposition step S05, a dry-etching step S06, an ashing step S07, and a post-treatment step S08.

In the pre-treatment step S01 shown in FIG. 2, the silicon substrate S is subjected to pretreatment by, for example, heat-treatment of 200° C. or more using a known lamp heater or the like.

Figure 3:
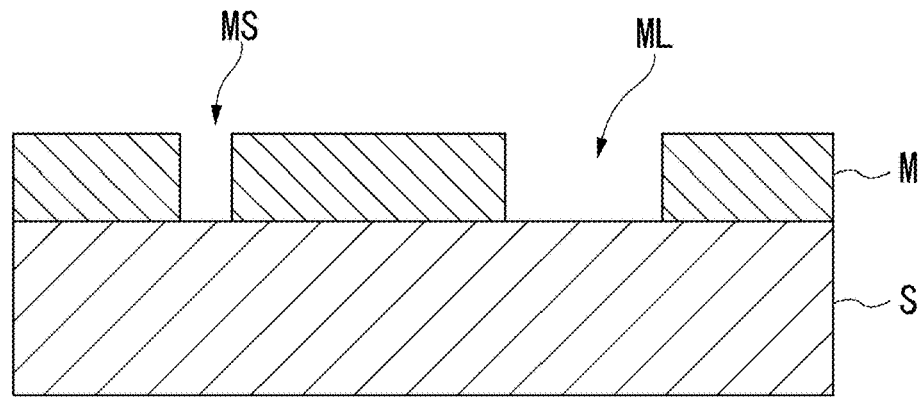
FIG. 3 is a cross-sectional view showing a step of the silicon dry etching method according to the first embodiment of the invention.

FIG. 3 is a cross-sectional view showing a step of the silicon dry etching method according to the embodiment.

In the mask-pattern forming step S02 shown in FIG. 2, a mask layer M is formed on the surface of the silicon substrate S as shown in FIG. 3.

The mask layer M can be formed of, for example, a SiO₂ film, a SiN film, a metal film (metal, or the like) which is not removed by O₂ plasma.

Furthermore, the mask layer M can be formed by a plasma CVD method, a metal sputtering method, or the like.

Moreover, in the mask-pattern forming step S02, as shown in FIG. 3, an opening pattern (mask pattern) MS that sets a processing region so as to correspond to the shape of the recess pattern VS on the silicon substrate S and an opening pattern (mask pattern) ML that sets a processing region so as to correspond to the shape of the recess pattern VL are formed on the mask layer M.

Particularly, in the mask-pattern forming step S02, a photoresist layer not shown in the drawings is layered on the metal film, the photoresist layer is subjected to processes such as exposure, development, or the like, and furthermore the mask layer M having the opening pattern MS and the opening pattern ML is formed by carrying out a known process such as a dry etching process or the like.

Figure 4:
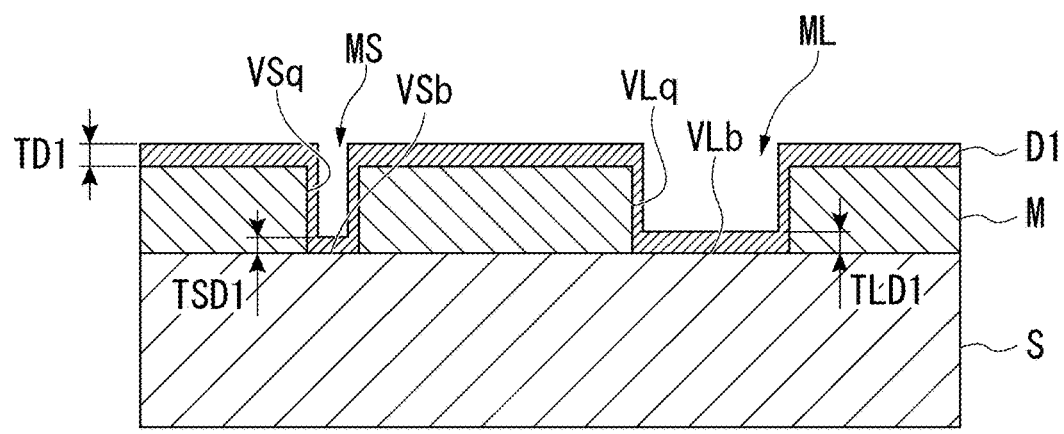
FIG. 4 is a cross-sectional view showing a step of the silicon dry etching method according to the first embodiment of the invention.

FIG. 4 is a cross-sectional view showing a step of the silicon dry etching method according to the embodiment.

In the deposition step S05 shown in FIG. 2, a deposition layer D1 made of a polymer such as fluorocarbon or the like is formed on the entire surface of the silicon substrate S by anisotropic plasma processing as shown in FIG. 4 such that side walls of the recess pattern VS and the recess pattern VL can be protected from being etched by the dry-etching step S06.

The deposition layer D1 is formed in order to protect the side walls VSq and VLq of the recess patterns VS and VL from being etched, respectively, and in order to limitedly carry out etching with respect to the bottom portions VSb and VLb of the recess patterns VS and VL, respectively. Consequently, the vertical side walls VSq and VLq are obtained in the dry-etching step S06, which is etching using a fluorine compound.

The deposition layer D1 is layered (coated) on the surface of the mask layer M and the bottom portions VSb and VLb of the recess patterns VS and VL. Although the deposition layer D1 coated on the side walls VSq and VLq of the recess patterns VS and VL, respectively, is shown in FIG. 4, practically, the deposition layer D1 is almost not formed thereon.

In the deposition step S05, a plasma processing is carried out using a fluorocarbon gas such as $CHF_3$, $C_2F_6$, $C_2F_4$, $C_4F_8$, or the like. Here, a plasma-processing apparatus 10 described later is used in order to shorten a deposition time.

At this time, in the plasma-processing apparatus 10, as described below, the frequency λ2 of high-frequency power applied to a second electrode E2 (inside electrode) located at the inner-periphery side thereof can be set higher than the frequency λ3 of high-frequency power applied to a third electrode E3 (outside electrode) located at the outer-periphery side thereof. Specifically, for example, the frequency λ2 may be 13.65 MHz, and the frequency λ3 may be 2 MHz. In the deposition step S05, the maximum value of the power supplied to the electrodes positioned at the inner-periphery and the outer-periphery is the value of the power which the power source can output. Consequently, it is possible to improve the ashing rate.

Additionally, in the plasma-processing apparatus 10, as described below, the frequency λ2 of the value of the high-frequency power applied to the second electrode E2 located at the inner-periphery can be set lower than the values of the power of the dry-etching step S06 and the ashing step S07 described later. Furthermore, in the plasma-processing apparatus 10, a bias voltage may not be applied to a first electrode 12. In the atmosphere in which the deposition step S05 is carried out, a predetermined pressure is set, and a deposition process is carried out. Moreover, in the deposition step S05, for example, a noble gas such as Ar or the like may be added to a gas used in deposition at a predetermined amount.

Regarding the film thickness of the deposition layer D1 formed by the deposition step S05, the film thickness of the deposition layer D1 formed on the bottom portion VLb corresponding to the opening pattern ML having a large diameter becomes larger than the film thickness of the deposition layer D1 formed on the bottom portion VSb corresponding to the opening pattern MS having a small diameter. Note that, the film thickness of the deposition layer D1 formed on the bottom portion VLb of the opening pattern ML becomes equal to or smaller than the film thickness of the deposition layer D1 formed on the surface of the mask layer M located outside the opening patterns MS and ML.

That is, regarding the film thickness of the deposition layer D1, the film thicknesses gradually become smaller in the order of the film thickness TD1 of the deposition layer D1 formed on the surface of the mask layer M positioned outside the opening patterns MS and ML, the film thickness TLD1 of the deposition layer D1 formed on the bottom portion VLb of the opening pattern ML, and the film thickness TSD1 of the deposition layer D1 formed on the bottom portion VSb of the opening pattern MS.

In the deposition step S05, the deposition coverage of the deposition layer D1 of the bottom portions VSb and VLb corresponding to the opening patterns MS and ML, respectively, can be controlled so as to obtain optimized deposition coverage by setting deposition conditions as described above. Here, a preferred condition for forming the deposition coverage is to shorten a processing time required for causing the deposition layer D1 having a necessary film thickness to be layered on the bottom portions VSb and VLb. That is, the preferred condition for forming the deposition coverage is to increase the film-formation rate at which the deposition layer D1 is layered on the bottom portions VSb and VLb.

Additionally, the preferred condition for forming the deposition coverage is to control the deposition coverage in accordance with the etching depth and the aspect ratio. That is, as described below, even in the case in which the aspect ratio is changed depending on variation in the depths of the bottom portions VSb and VLb, it is possible to form the deposition layer D1 having a desired thickness at a predetermined film-formation rate.

Furthermore, the preferred condition for forming the deposition coverage is to improve uniformity and reliability with respect to the deposition layer D1 layered on the bottom portion VSb and uniformity and reliability with respect to the deposition layer D1 layered on the bottom portion VLb.

Figure 5:
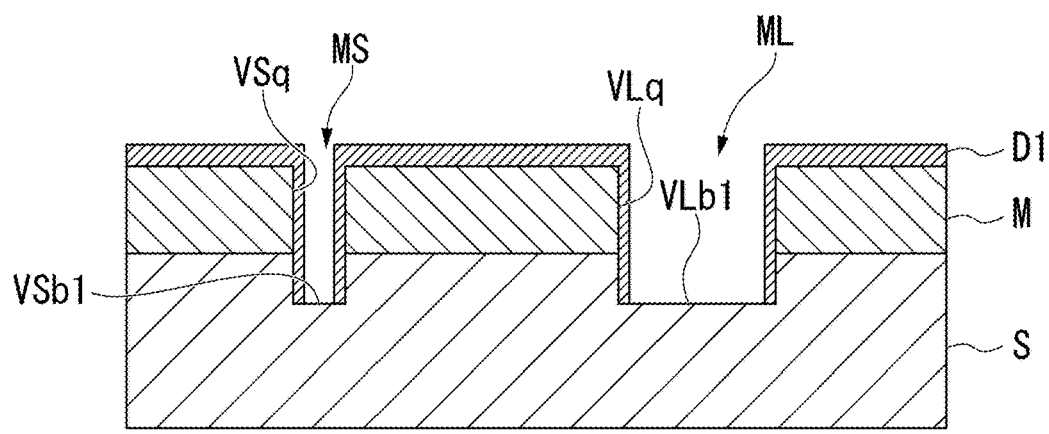
FIG. 5 is a cross-sectional view showing a step of the silicon dry etching method according to the first embodiment of the invention.

FIG. 5 is a cross-sectional view showing a step of the silicon dry etching method according to the embodiment.

In the dry-etching step S06 shown in FIG. 2, the bottom portions VSb and VLb corresponding to the opening patterns MS and ML are etched by anisotropic plasma etching as shown in FIG. 5, the positions of the bottom portions VSb and VLb are lowered, and thereby the bottom portions VSb1 and VLb1 are formed.

At this time, the depths of the bottom portion VSb1 corresponding to the opening pattern MS and the bottom portion VLb1 corresponding to the opening pattern ML formed by the dry-etching step S06 are set to be uniform by the processing conditions of the dry-etching step S06 and the plasma anisotropy thereof and the difference between the film thickness of the deposition layers D1 formed by the deposition step S05.

Particularly, the film thickness TSD1 of the deposition layer D1 layered on the bottom portion VSb corresponding to the opening pattern MS is smaller than the film thickness TLD1 of the deposition layer D1 layered on the bottom portion VLb corresponding to the opening pattern ML. Moreover, the etching amount with respect to the bottom portion VSb corresponding to the opening pattern MS is smaller than the etching amount with respect to the bottom portion VLb corresponding to the opening pattern ML. Therefore, the film thickness of the deposition layer formed by the aforementioned deposition and the etching amount of the aforementioned etching are balanced, and the depth of the bottom portion VSb1 corresponding to the opening pattern MS and the depth of the bottom portion VLb1 corresponding to the opening pattern ML are uniform.

Additionally, an effect of the etching with respect to the side walls VSq and VLq corresponding to the opening patterns MS and ML, respectively, is extremely reduced by the processing conditions of the dry-etching step S06 and the plasma anisotropy thereof and by the deposition layer D1. For this reason, the side walls VSq and VLq are vertical to the surface of the silicon substrate S and are on substantially the same plane. Accordingly, the side walls VSq and VLq without irregularities are formed so as to extend in the depth direction.

That is, as the recess patterns VS and VL, the bottom portions VSb1 and VLb1 are formed so as to have a uniform diameter.

The plasma-processing apparatus 10 described later is used to generate plasma with high anisotropy in the dry-etching step S06 so as to achieve this shape.

At this time, in the plasma-processing apparatus 10, as described below, the frequency $\lambda 2$ of high-frequency power applied to the second electrode E2 located at the inner-periphery thereof can be set higher than the frequency $\lambda 3$ of high-frequency power applied to the third electrode E3 located at the outer-periphery thereof. Specifically, for example, the frequency $\lambda 2$ may be 13.65 MHz, and the frequency $\lambda 3$ may be 2 MHz.

Moreover, in the plasma-processing apparatus 10, as described below, the value of the high-frequency power of the frequency $\lambda 2$ applied to the second electrode E2 located at the inner-periphery is higher than the value of the deposition step S05 and is set to be the same as the value of the supply power in the ashing step S07.

Additionally, in the plasma-processing apparatus 10, as described below, the value of the high-frequency power of the frequency $\lambda 2$ applied to the second electrode E2 located at the inner-periphery can be set to be the same as the value of the high-frequency power of the frequency $\lambda 3$ applied to the third electrode E3 located at the outer-periphery.

Moreover, in the plasma-processing apparatus 10, it is preferable to apply a bias voltage with the frequency $\lambda 1$ to the first electrode 12. The frequency $\lambda 1$ can be set lower than the frequency $\lambda 3$ of high-frequency power applied to the third electrode E3 located at the outer-periphery. The frequency $\lambda 1$ may be, for example, 400 kHz.

Furthermore, in the anisotropic plasma etching of the dry-etching step S06, a mixed gas of $SF_6$ and $O_2$ is decomposed by plasma, and anisotropic etching with respect to Si is carried out. For this reason, Si is etched by the F-radical generated due to decomposition of $SF_6$ (F+Si→$SiF_4$). This etching reaction occurs in isotropic etching. In order to carry out anisotropic etching, the etching reaction with respect to the side walls VSq and VLq may be suppressed by forming an insulating layer (protective film) that adheres to the side walls VSq and VLq.

In the anisotropic plasma etching using the mixed gas of $SF_6/O_2$ in the dry-etching step S06, the deposition layer D1 is removed from the side walls VSq and VLq corresponding to the opening patterns MS and ML, respectively, and the side walls VSq and VLq are exposed.

Here, in the anisotropic plasma etching using the mixed gas of $SF_6/O_2$ in the dry-etching step S06, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, in the dry-etching step S06, $SiF_4$ can be used as an etching gas in order to prevent lack of the etching product of $SiF_4$.

Moreover, in the dry-etching step S06, $SF_6$ or $NF_3$ is used as an etching gas, $SiF_4$ serving as a silicon compound is added to the etching gas, and $O_2$, $N_2$, $N_2O$, NO, $NO_x$, or $CO_2$, which serves as a reactant, is added to the gas. Accordingly, the bottom portion can be intensively etched.

Furthermore, in the dry-etching step S06, a substrate temperature during processing is lowered by using the first electrode 12 that includes a cooling medium pathway thereinside and is provided with an electrostatic chuck, and therefore it is possible to increase a degree of anisotropy. For example, the temperature of a cooling medium flowing to the cooling medium pathway is set lower than 10° C.

Figure 6:
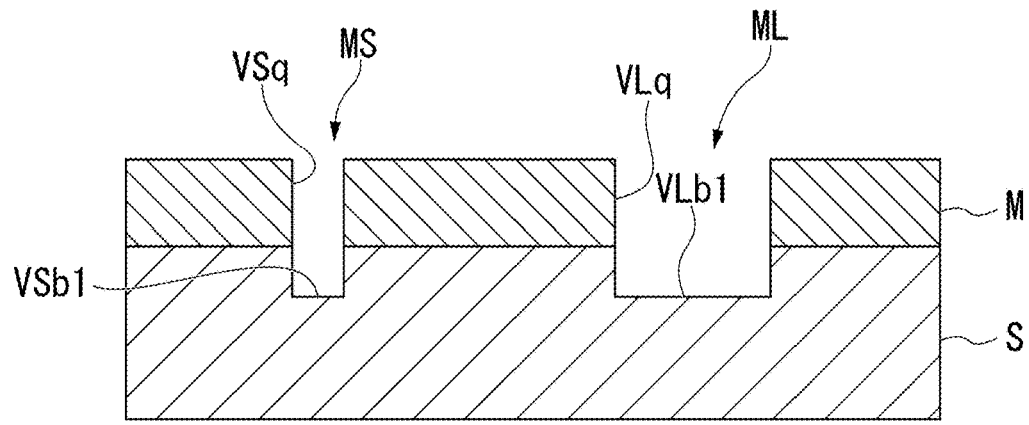
FIG. 6 is a cross-sectional view showing a step of the silicon dry etching method according to the first embodiment of the invention.

FIG. 6 is a cross-sectional view showing a step of the silicon dry etching method according to the embodiment.

In the ashing step S07 shown in FIG. 2, the remaining deposition layer D1 is removed after the dry-etching step S06 is completed as shown in FIG. 6.

Particularly, in the ashing step S07, an ashing condition is set so as to reliably remove the deposition layer D1 that remains on the region close to the inner-peripheries of the opening pattern MS and the opening pattern ML of the mask layer M.

In the ashing step S07, after the dry-etching step S06 is completed, the deposition layer D1 adhered to the surface of the mask layer M, the deposition layer D1 that remains on the region close to the inner-peripheries of the opening pattern MS and the opening pattern ML of the mask layer M, and the deposition layers D1 that remain on the side walls VSq and VLq corresponding to the opening patterns MS and ML, respectively, are removed. Furthermore, in the case in which the deposition layer D1 remains on the bottom portion VSb1 corresponding to the opening pattern MS and the deposition layer D1 remains on the bottom portion VLb1 corresponding to the opening pattern ML, the remaining deposition layers are removed.

Here, it is most important to remove the deposition layer D1 that remains at the inner-periphery position of the opening pattern MS and the deposition layer D1 that remains at the inner-periphery position of the opening pattern ML. In the case in which the deposition layer D1 remains without being removed, a deposition layer D2 is further deposited on the remaining deposition layer D1 by carrying out the deposition step S05 of the second cycle in the cycle of repetitively carrying out the deposition step S05, the dry-etching step S06, and the ashing step S07. In this case, the opening diameters (opening space) of the opening pattern MS and the opening pattern ML of the mask layer M decrease.

In the following explanation, the cycle of repetitively carrying out the deposition step S05, the dry-etching step S06, and the ashing step S07 which are shown in FIG. 2 may be simply referred to as "repetitive cycle".

As described above, in the case in which the opening diameters of the opening pattern MS and the opening pattern ML of the mask layer M decrease, even where the etching with a high degree of anisotropy is carried out in the dry-etching step S06 of the second cycle carried out next to the ashing step S07 of the first cycle of the repetitive cycles, the deposition layer D1 and the deposition layer D2 inhibit the etching plasma from reaching the bottom portion VSb1 and the bottom portion VLb1. Accordingly, the etching with respect to the bottom portion VSb1 and the bottom portion VLb1 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in a state in which the deposition layer D1 does not remain at the inner-periphery position of the opening pattern MS and the deposition layer D1 does not remain at the inner-periphery position of the opening pattern ML, the deposition layer D2 is not further deposited on the remaining deposition layer D1 in the deposition step S05 of the second cycle carried out next to the first cycle of the repetitive cycles. For this reason, the opening diameters (opening space) of the opening pattern MS and the opening pattern ML of the mask layer M can be maintained so as to have a predetermined size.

Therefore, in the dry-etching step S06 of the second cycle of the repetitive cycles, as a result of carrying out the etching with a high degree of anisotropy, reach of the etching plasma to the bottom portion VSb1 and the bottom portion VLb1 is not inhibited by the deposition layer D1 and the deposition layer D2. Consequently, the etching with respect to the bottom portion VSb1 and the bottom portion VLb1 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape, and it is possible to form each of the recess patterns VS and VL with a high-aspect ratio so as to have a uniform diameter in the depth direction.

In the ashing step S07 of the first cycle, as described above, it is necessary to carry out the plasma processing with a high degree of ionization to the using $O_2$ gas in order to reliably remove the deposition layer D1 that remains on the inner-periphery positions of the opening patterns MS and ML. Therefore, also in the ashing step S07 of the first cycle, the plasma-processing apparatus 10 described later is used.

At this time, in the plasma-processing apparatus 10 used in the ashing step S07 of the first cycle, as described below, the frequency $\lambda 2$ of high-frequency power applied to the second electrode E2 located at the inner-periphery side thereof can be set higher than the frequency $\lambda 3$ of high-frequency power applied to the third electrode E3 located at the outer-periphery side thereof. Specifically, for example, the frequency $\lambda 2$ may be 13.65 MHz, and the frequency $\lambda 3$ may be 2 MHz.

Moreover, in the plasma-processing apparatus 10 used in the ashing step S07 of the first cycle, as described below, the value of the high-frequency power of the frequency $\lambda 2$ applied to the second electrode E2 located at the inner-periphery is higher than the value of that of the deposition step S05 and is set to be the same as the value of that of the dry-etching step S06.

Additionally, in the plasma-processing apparatus 10 used in the ashing step S07 of the first cycle, as described below, the value of the high-frequency power of the frequency $\lambda 2$ applied to the second electrode E2 located at the inner-periphery can be set to be the same as the value of the high-frequency power of the frequency $\lambda 3$ applied to the third electrode E3 located at the outer-periphery.

Moreover, in the plasma-processing apparatus 10 used in the ashing step S07 of the first cycle, it is preferable to apply a bias voltage with the frequency $\lambda 1$ to the first electrode 12. The frequency $\lambda 1$ can be set lower than the frequency $\lambda 3$ of high-frequency power applied to the third electrode E3 located at the outer-periphery. The frequency $\lambda 1$ may be, for example, 400 kHz.

Moreover, in the plasma-processing apparatus 10 used in the ashing step S07 of the first cycle, it is preferable to apply the bias voltage to the first electrode 12. The power of the bias voltage of the ashing step S07 of the first cycle can be set to be equal to the power of the bias voltage of the dry-etching step S06 of the first cycle or higher than the power of the bias voltage of the dry-etching step S06 of the first cycle.

In the ashing step S07 of the first cycle, it is possible to carry out the ashing by supply of $O_2$ gas. According to the anisotropic plasma processing using the $O_2$ gas, the deposition layer D1 is reliably removed and the side walls VSq and VLq are exposed at the portions close to the inner-peripheries of the opening patterns MS and ML, and the side walls VSq and VLq corresponding to the opening patterns MS and ML, respectively. At the same time, although ashing is carried out by supply of $O_2$ gas in the ashing step S07 of the first cycle, since the mask layer M is formed of a $SiO_2$ film, a SiN film, a metal film (metal or the like), the mask layer M is not removed by the $O_2$ plasma. In the silicon dry etching method according to the embodiment, the deposition step S05, the dry-etching step S06, and the ashing step S07 serve as one process cycle as shown in FIG. 2, and the process cycle is repetitively carried out. In this way, the depths of the recess patterns VS and VL become longer.

Next, the second cycle will be described.

Figure 7:
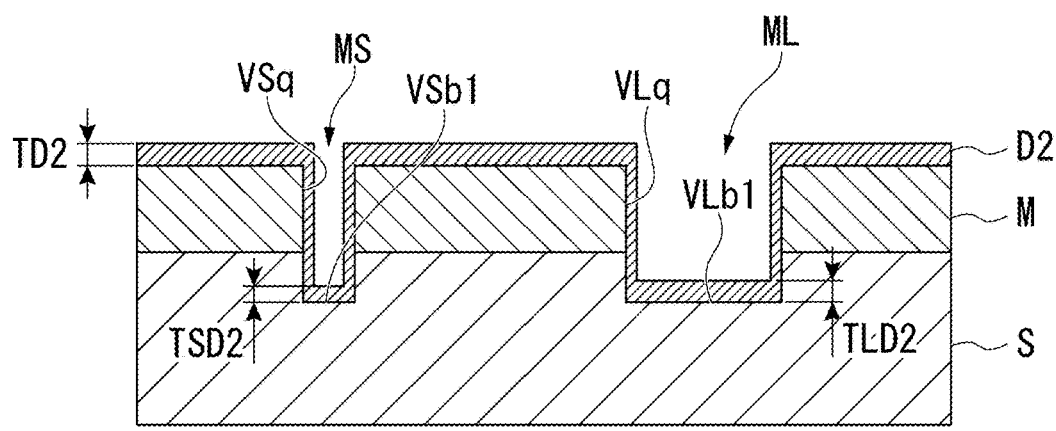
FIG. 7 is a cross-sectional view showing a step of the silicon dry etching method according to the first embodiment of the invention.

FIG. 7 is a cross-sectional view showing a step of the silicon dry etching method according to the embodiment.

In the deposition step S05 shown in FIG. 2 of the second cycle, a deposition layer D2 made of a polymer such as fluorocarbon or the like is formed on the entire surface of the silicon substrate S by anisotropic plasma processing as shown in FIG. 7. Therefore, side walls of the recess pattern VS and the recess pattern VL can be protected from being etched by the dry-etching step S06 carried out after the deposition step S05 of the second cycle.

The deposition layer D2 is formed in order to protect the side walls VSq and VLq of the recess patterns VS and VL from being etched, respectively, and in order to limitedly carry out etching with respect to the bottom portions VSb1 and VLb1 of the recess patterns VS and VL, respectively. Consequently, the vertical side walls VSq and VLq are obtained by carrying out the etching using a fluorine compound in the dry-etching step S06 carried out after the deposition step S05 of the second cycle.

The deposition layer D2 is layered (coated) on the surface of the mask layer M and the bottom portions VSb1 and VLb1 of the recess patterns VS and VL. Although the deposition layer D2 coated on the side walls VSq and VLq of the recess patterns VS and VL, respectively, is shown in FIG. 7, practically, the deposition layer D2 is almost not formed on the side walls VSq and VLq.

In the deposition step S05 of the second cycle, similar to the above-described deposition step, an anisotropic plasma processing is carried out using a fluorocarbon gas such as $CHF_3$, $C_2F_6$, $C_2F_4$, $C_4F_8$, or the like. The plasma-processing apparatus 10 described later is used to generate plasma with high anisotropy in the deposition step S05.

In the plasma-processing apparatus 10 in the deposition step S05 of the second cycle, as described below, the frequency $\lambda 2$ of high-frequency power applied to the second electrode E2 located at the inner-periphery thereof can be set higher than the frequency $\lambda 3$ of high-frequency power applied to the third electrode E3 located at the outer-periphery thereof. Specifically, for example, the frequency $\lambda 2$ may be 13.65 MHz, and the frequency $\lambda 3$ may be 2 MHz.

Here, in the deposition step S05 to be carried out after the second cycle, the deposition conditions can be set to be the same as those of the deposition step S05 of the first cycle.

Additionally, in the plasma-processing apparatus 10 in the deposition step S05 of the second cycle, as described below, the frequency $\lambda 2$ of the value of the high-frequency power applied to the second electrode E2 located at the inner-periphery can be set lower than the values of the dry-etching step S06 and the ashing step S07 described later. Furthermore, in the plasma-processing apparatus 10, a bias voltage may not be applied to a first electrode 12.

In the deposition step S05 of the second cycle, the process is carried out in an atmosphere having a predetermined pressure. Moreover, in the deposition step S05 of the second cycle, the deposition conditions can be set to be the same as those of the deposition step S05 of the first cycle. However, the deposition condition of the deposition step S05 of the second cycle may be different from that of the first cycle in order to suppress a reduction in the deposition rate with respect to the bottom portions VSb1 and VLb1 of the recess patterns VS and VL. As the deposition condition, for example, any one of the high-frequency power applied to the second electrode E2 located at the inner-periphery and the high-frequency power applied to the third electrode E3 located at the outer-periphery may increase. Furthermore, as the deposition condition, for example, both the high-frequency power applied to the second electrode E2 and the high-frequency power applied to the third electrode E3 may increase. Moreover, as the deposition condition, a condition of applying a bias voltage may be adopted in order to attract deposition particles to the bottom portions VSb1 and VLb1.

The film thickness of the deposition layer D2 formed by the deposition step S05 of the second cycle is the same as that of the deposition step S05 of the first cycle. That is, the film thickness of the deposition layer D2 formed on the bottom portion VLb corresponding to the opening pattern ML having the large diameter becomes larger than the film thickness of the deposition layer D2 formed on the bottom portion VSb corresponding to the opening pattern MS having the small diameter. Note that, the film thickness of the deposition layer D2 formed on the bottom portion VLb of the opening pattern ML becomes equal to or smaller than the film thickness of the deposition layer D2 formed on the surface of the mask layer M located outside the opening patterns MS and ML.

That is, regarding the film thickness of the deposition layer D2, the film thicknesses gradually become smaller in the order of the film thickness TD2 of the deposition layer D2 formed on the surface of the mask layer M positioned outside the opening patterns MS and ML, the film thickness TLD2 of the deposition layer D2 formed on the bottom portion VLb1 of the opening pattern ML, and the film thickness TSD2 of the deposition layer D2 formed on the bottom portion VSb1 of the opening pattern MS.

In the deposition step S05 of the second cycle, the deposition coverage of the deposition layer D2 of the bottom portions VSb1 and VLb1 corresponding to the opening patterns MS and ML, respectively, can be controlled so as to obtain optimized deposition coverage by setting deposition conditions as described above. Here, a preferred condition for forming the deposition coverage is to shorten a processing time required for causing the deposition layer D2 having a necessary film thickness to be layered on the bottom portions VSb1 and VLb1. That is, the preferred condition for forming the deposition coverage is to increase the film-formation rate at which the deposition layer D2 is layered on the bottom portions VSb1 and VLb1.

Furthermore, in the deposition step S05 of the second cycle, the preferred condition for forming the deposition coverage is to control the deposition coverage in accordance with the etching depth and the aspect ratio. That is, as described below, the depths of the bottom portions VSb and VLb are different from the depths of the bottom portions VSb1 and VLb1, and therefore the depths of the bottom portions are changed. Even in the case in which the aspect ratio is changed depending on variation in the depths of the bottom portions as described above, it is possible to form the deposition layer D2 having a desired thickness at a predetermined film-formation rate.

Furthermore, the preferred condition for forming the deposition coverage is to improve uniformity and reliability with respect to the deposition layer D2 layered on the bottom portion VSb1 and uniformity and reliability with respect to the deposition layer D2 layered on the bottom portion VLb1.

Additionally, the processing time of the deposition step S05 of the second cycle can be longer than the processing time of the deposition step S05 of the first cycle. Particularly, the above-described setting of the processing time is the same as that of the deposition step S05 carried out after the third cycle.

Figure 8:
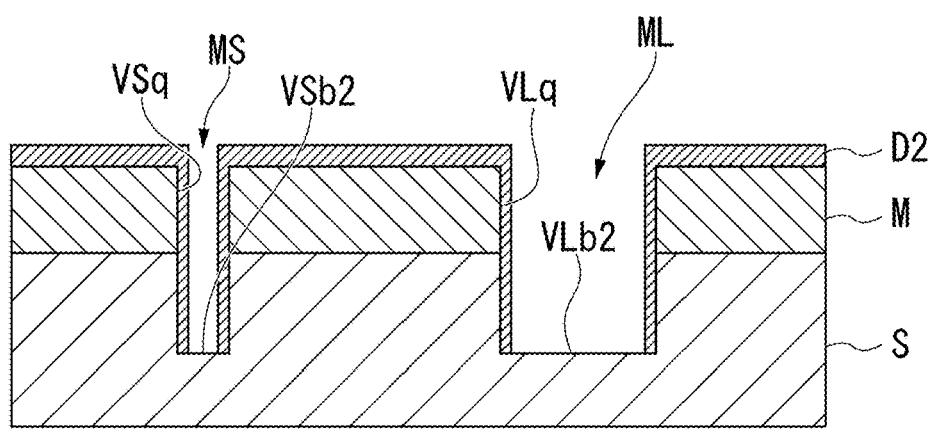
FIG. 8 is a cross-sectional view showing a step of the silicon dry etching method according to the first embodiment of the invention.

FIG. 8 is a cross-sectional view showing a step of the silicon dry etching method according to the embodiment.

In the dry-etching step S06 of the second cycle shown in FIG. 2, the bottom portions VSb1 and VLb1 corresponding to the opening patterns MS and ML are etched by anisotropic plasma etching as shown in FIG. 8, the positions of the bottom portions VSb1 and VLb1 are lowered, and thereby the bottom portions VSb2 and VLb2 are formed.

At this time, the depths of the bottom portion VSb2 corresponding to the opening pattern MS and the bottom portion VLb2 corresponding to the opening pattern ML formed by the dry-etching step S06 of the second cycle are set to be uniform by the processing conditions of the dry-etching step S06 of the second cycle and the plasma anisotropy thereof and the difference between the film thickness of the deposition layers D2 formed by the deposition step S05.

Particularly, the film thickness TSD2 of the deposition layer D2 layered on the bottom portion VSb1 corresponding to the opening pattern MS is smaller than the film thickness TLD2 of the deposition layer D2 layered on the bottom portion VLb1 corresponding to the opening pattern ML. Moreover, the etching amount with respect to the bottom portion VSb1 corresponding to the opening pattern MS is smaller than the etching amount with respect to the bottom portion VLb1 corresponding to the opening pattern ML. Therefore, the film thickness of the deposition layer formed by the aforementioned deposition and the etching amount of the aforementioned etching are balanced, and the depth of the bottom portion VSb2 corresponding to the opening pattern MS and the depth of the bottom portion VLb2 corresponding to the opening pattern ML are uniform.

Additionally, an effect of the etching with respect to the side walls VSq and VLq corresponding to the opening patterns MS and ML, respectively, is extremely reduced by the processing conditions of the dry-etching step S06 of the second cycle and the plasma anisotropy thereof and by the deposition layer D2. For this reason, the side walls VSq and VLq are vertical to the surface of the silicon substrate S and are on substantially the same plane. Accordingly, the side walls VSq and VLq without irregularities are formed so as to extend in the depth direction.

That is, as the recess patterns VS and VL, the bottom portions VSb2 and VLb2 are formed so as to have a uniform diameter.

Also in the dry-etching step S06 of the second cycle, the plasma-processing apparatus 10 described later is used to generate plasma with high anisotropy so as to achieve this shape. At this time, the setting conditions of the plasma-processing apparatus 10 used in the dry-etching step S06 of the second cycle are the same as those of the first cycle. That is, as described below, the frequency $\lambda 2$ of high-frequency power applied to the second electrode E2 located at the inner-periphery can be set higher than the frequency $\lambda 3$ of high-frequency power applied to the third electrode E3 located at the outer-periphery. Specifically, for example, the frequency $\lambda 2$ may be 13.65 MHz, and the frequency $\lambda 3$ may be 2 MHz.

Moreover, also in the dry-etching step S06 of the second cycle, the setting conditions of the plasma-processing apparatus 10 are the same as those of the first cycle. That is, as described below, the value of the high-frequency power of the frequency $\lambda 2$ applied to the second electrode E2 located at the inner-periphery is higher than the value of the deposition step S05 of the second cycle and is set to be the same as the value of the supply power in the ashing step S07 of the second cycle.

Moreover, also in the dry-etching step S06 of the second cycle, the setting conditions of the plasma-processing apparatus 10 are the same as those of the first cycle. Particularly, as described below, the value of the high-frequency power of the frequency $\lambda 2$ applied to the second electrode E2 located at the inner-periphery can be set to be the same as the value of the high-frequency power of the frequency $\lambda 3$ applied to the third electrode E3 located at the outer-periphery.

Also in the dry-etching step S06 of the second cycle, the setting conditions of the plasma-processing apparatus 10 are the same as those of the first cycle. That is, it is preferable to apply a bias voltage with the frequency $\lambda 1$ to the first electrode 12. The frequency $\lambda 1$ can be set lower than the frequency $\lambda 3$ of high-frequency power applied to the third electrode E3 located at the outer-periphery. The frequency $\lambda 1$ may be, for example, 400 kHz.

Furthermore, the anisotropic plasma etching of the dry-etching step S06 of the second cycle is the same as that of the first cycle. Particularly, the mixed gas of $SF_6$ and $O_2$ is decomposed by plasma, and the anisotropic etching with respect to Si is carried out. For this reason, Si is etched by the F-radical generated due to decomposition of $SF_6$ (F+Si→$SiF_4$). This etching reaction occurs in isotropic etching. In order to carry out anisotropic etching, the etching reaction with respect to the side walls VSq and VLq may be suppressed by forming a protective film that adheres to the side walls VSq and VLq.

The anisotropic plasma etching using the mixed gas of $SF_6/O_2$ in the dry-etching step S06 of the second cycle is the same as that of the first cycle. That is, the deposition layer D2 is removed from the side walls VSq and VLq corresponding to the opening patterns MS and ML, respectively, and the side walls VSq and VLq are exposed.

Here, the anisotropic plasma etching using the mixed gas of $SF_6/O_2$ in the dry-etching step S06 of the second cycle is the same as that of the first cycle. That is, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, similar to the first cycle, in the dry-etching step S06 of the second cycle, $SiF_4$ can be used as an etching gas in order to prevent lack of the etching product of $SiF_4$.

Moreover, the dry-etching step S06 of the second cycle is the same as that of the first cycle. That is, $SF_6$ or $NF_3$ is used as an etching gas, $SiF_4$ serving as a silicon compound is added to the etching gas, and $O_2$, $N_2$, $N_2O$, NO, $NO_x$, or $CO_2$ which serves as a reactant is added to the gas. Accordingly, the bottom portion can be intensively etched.

Additionally, the processing time of the dry-etching step S06 of the second cycle can also be longer than the processing time of the dry-etching step S06 of the first cycle. Particularly, the above-described setting of the processing time is the same as that of the dry-etching step S06 carried out after the third cycle.

Figure 9:
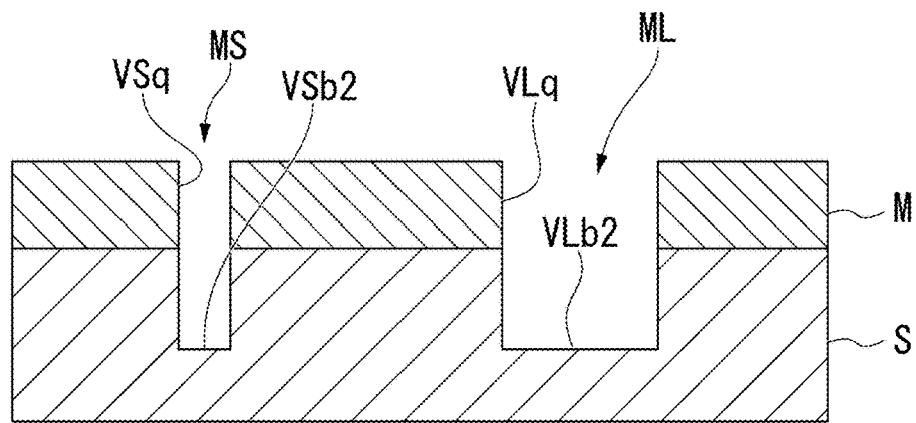
FIG. 9 is a cross-sectional view showing a step of the silicon dry etching method according to the first embodiment of the invention.

FIG. 9 is a cross-sectional view showing a step of the silicon dry etching method according to the embodiment.

In the ashing step S07 of the second cycle shown in FIG. 2, the remaining deposition layer D2 is removed after the dry-etching step S06 of the second cycle is completed as shown in FIG. 9.

Particularly, in the ashing step S07 of the second cycle, an ashing condition is set so as to reliably remove the deposition layer D2 that remains on the region close to the inner-peripheries of the opening pattern MS and the opening pattern ML of the mask layer M.

The ashing step S07 of the second cycle is the same as that of the first cycle. That is, after the dry-etching step S06 of the second cycle is completed, the deposition layer D2 adhered to the surface of the mask layer M, the deposition layer D2 that remains on the region close to the inner-peripheries of the opening pattern MS and the opening pattern ML of the mask layer M, and the deposition layers D2 that remain on the side walls VSq and VLq corresponding to the opening patterns MS and ML, respectively, are removed.

Furthermore, in the case in which the deposition layer D2 remains on the bottom portion VSb2 corresponding to the opening pattern MS and the deposition layer D2 remains on the bottom portion VLb2 corresponding to the opening pattern ML, the deposition layers D2 are removed.

Here, it is most important to remove the deposition layer D2 that remains at the inner-periphery position of the opening pattern MS and the deposition layer D2 that remains at the inner-periphery position of the opening pattern ML. In the case in which the deposition layer D2 remains without being removed, a deposition layer D3 is further deposited on the remaining deposition layer D2 by carrying out the deposition step S05 of the third cycle in the repetitive cycles. In this case, the opening diameters (opening space) of the opening pattern MS and the opening pattern ML of the mask layer M decrease.

As described above, in the case in which the opening diameters of the opening pattern MS and the opening pattern ML of the mask layer M decrease, even where the etching with a high degree of anisotropy is carried out in the dry-etching step S06 of the third cycle carried out next to the second cycle, the deposition layer D2 and the deposition layer D3 inhibit the etching plasma from reaching the bottom portion VSb2 and the bottom portion VLb2. Accordingly, the etching with respect to the bottom portion VSb2 and the bottom portion VLb2 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in a state in which the deposition layer D2 does not remain at the inner-periphery position of the opening pattern MS and the deposition layer D2 does not remain at the inner-periphery position of the opening pattern ML, the deposition layer D3 is not further deposited on the remaining deposition layer D2 in the deposition step S05 of the third cycle carried out next to the second cycle of the repetitive cycles. For this reason, the opening diameters (opening space) of the opening pattern MS and the opening pattern ML of the mask layer M can be maintained so as to have a predetermined size.

Therefore, in the dry-etching step S06 of the third cycle of the repetitive cycles, as a result of carrying out the etching with a high degree of anisotropy, reach of the etching plasma to the bottom portion VSb2 and the bottom portion VLb2 is not inhibited by the deposition layer D2 and the deposition layer D3. Consequently, the etching with respect to the bottom portion VSb2 and the bottom portion VLb2 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape, and it is possible to form each of the recess patterns VS and VL with a high-aspect ratio so as to have a uniform diameter in the depth direction.

In the ashing step S07 of the second cycle, similar to the first cycle described above, it is necessary to generate plasma with high anisotropy in order to reliably remove the deposition layer D2 that remains at the inner-periphery positions of the opening patterns MS and ML. Therefore, also in the ashing step S07 of the second cycle, the plasma-processing apparatus 10 described later is used.

At this time, the setting conditions of the plasma-processing apparatus 10 used in the ashing step S07 of the second cycle are the same as those of the first cycle. That is, as described below, the frequency $\lambda 2$ of high-frequency power applied to the second electrode E2 located at the inner-periphery side thereof can be set higher than the frequency $\lambda 3$ of high-frequency power applied to the third electrode E3 located at the outer-periphery side thereof. Specifically, for example, the frequency $\lambda 2$ may be 13.65 MHz, and the frequency $\lambda 3$ may be 2 MHz.

Moreover, the setting conditions of the plasma-processing apparatus 10 used in the ashing step S07 of the second cycle are the same as those of the first cycle. Particularly, as described below, the value of the high-frequency power of the frequency $\lambda 2$ applied to the second electrode E2 located at the inner-periphery is higher than the value of the deposition step S05 and is set to be the same as the value of the supply power in the dry-etching step S06 of the second cycle.

Moreover, the setting conditions of the plasma-processing apparatus 10 used in the ashing step S07 of the second cycle are the same as those of the first cycle. That is, as described below, the value of the high-frequency power of the frequency $\lambda 2$ applied to the second electrode E2 located at the inner-periphery can be set to be the same as the value of the high-frequency power of the frequency $\lambda 3$ applied to the third electrode E3 located at the outer-periphery.

Also, the setting conditions of the plasma-processing apparatus 10 used in the ashing step S07 of the second cycle are the same as those of the first cycle. Particularly, it is preferable to apply a bias voltage with the frequency $\lambda 1$ to the first electrode 12. The frequency $\lambda 1$ can be set lower than the frequency $\lambda 3$ of high-frequency power applied to the third electrode E3 located at the outer-periphery. The frequency $\lambda 1$ may be, for example, 400 kHz.

Additionally, the setting conditions of the plasma-processing apparatus 10 used in the ashing step S07 of the second cycle are the same as those of the first cycle. Particularly, it is preferable to apply the bias voltage to the first electrode 12. The power of the bias voltage of the ashing step S07 of the second cycle can be set to be equal to the power of the bias voltage of the dry-etching step S06 of the second cycle or higher than the power of the bias voltage of the dry-etching step S06 of the second cycle.

In the ashing step S07 of the second cycle, it is possible to carry out the ashing by supply of $O_2$ gas. According to the anisotropic plasma processing using the $O_2$ gas, the deposition layer D2 is reliably removed and the side walls VSq and VLq are exposed at the portions close to the inner-peripheries of the opening patterns MS and ML, and the side walls VSq and VLq corresponding to the opening patterns MS and ML, respectively. At the same time, although ashing is carried out by supply of $O_2$ gas in the ashing step S07 of the second cycle, since the mask layer M is formed of a $SiO_2$ film, a SiN film, a metal film (metal or the like), the mask layer M is not removed by the $O_2$ plasma.

In the silicon dry etching method according to the embodiment, the deposition step S05, the dry-etching step S06, and the ashing step S07 serve as one process cycle as shown in FIG. 2, and the process cycle is repetitively carried out. In this way, the depths of the recess patterns VS and VL become further longer.

Next, the third cycle will be described.

Figure 10:
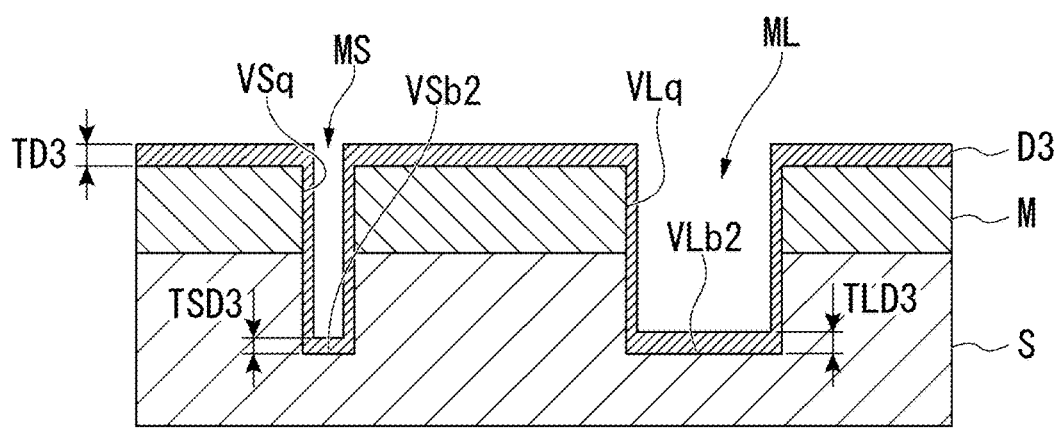
FIG. 10 is a cross-sectional view showing a step of the silicon dry etching method according to the first embodiment of the invention.

FIG. 10 is a cross-sectional view showing a step of the silicon dry etching method according to the embodiment.

In the deposition step S05 shown in FIG. 2 of the third cycle, a deposition layer D3 made of a polymer such as fluorocarbon or the like is formed on the entire surface of the silicon substrate S by anisotropic plasma processing as shown in FIG. 10. Therefore, side walls of the recess pattern VS and the recess pattern VL can be protected from being etched by the dry-etching step S06 carried out after the deposition step S05 of the third cycle.

The deposition layer D3 is formed in order to protect the side walls VSq and VLq of the recess patterns VS and VL from being etched, respectively, and in order to limitedly carry out etching with respect to the bottom portions VSb2 and VLb2 of the recess patterns VS and VL, respectively. Consequently, the vertical side walls VSq and VLq are obtained by carrying out the etching using a fluorine compound in the dry-etching step S06 carried out after the deposition step S05 of the third cycle.

The deposition layer D3 is layered (coated) on the surface of the mask layer M and the bottom portions VSb2 and VLb2 of the recess patterns VS and VL. Although the deposition layer D3 coated on the side walls VSq and VLq of the recess patterns VS and VL, respectively, is shown in FIG. 10, practically, the deposition layer D3 is almost not formed on the side walls VSq and VLq.

The deposition step S05 of the third cycle is the same as that of the second cycle. That is, an anisotropic plasma processing is carried out using a fluorocarbon gas such as $CHF_3$, $C_2F_6$, $C_2F_4$, $C_4F_8$, or the like. In the deposition step S05, the plasma-processing apparatus 10 described later is used to generate plasma with high anisotropy.

In the deposition step S05 of the third cycle, in the plasma-processing apparatus 10, as described below, the frequency $\lambda 2$ of high-frequency power applied to the second electrode E2 located at the inner-periphery thereof can be set higher than the frequency $\lambda 3$ of high-frequency power applied to the third electrode E3 located at the outer-periphery thereof. Specifically, for example, the frequency $\lambda 2$ may be 13.65 MHz, and the frequency $\lambda 3$ may be 2 MHz.

At this time, the setting conditions of the plasma-processing apparatus 10 may be the same as those of at least one of the deposition step S05 of the first cycle and the deposition step S05 of the second cycle.

Additionally, in the plasma-processing apparatus 10 in the deposition step S05 of the third cycle, as described below, the frequency $\lambda 2$ of the value of the high-frequency power applied to the second electrode E2 located at the inner-periphery can be set lower than the values of the dry-etching step S06 and the aching step S07 described later. Furthermore, in the plasma-processing apparatus 10, a bias voltage may not be applied to a first electrode 12.

In the deposition step S05 of the third cycle, the process is carried out in an atmosphere having a predetermined pressure. Moreover, in the deposition step S05 of the third cycle, the deposition conditions can be set to be the same as those of the deposition step S05 of at least one of the first cycle and the deposition step S05 of the second cycle.

The film thickness of the deposition layer D3 formed by the deposition step S05 of the third cycle is the same as that of the deposition step S05 of the second cycle. That is, the film thickness of the deposition layer D3 formed on the bottom portion VLb2 corresponding to the opening pattern ML having the large diameter becomes larger than the film thickness of the deposition layer D3 formed on the bottom portion VSb2 corresponding to the opening pattern MS having the small diameter. Note that, the film thickness of the deposition layer D3 formed on the bottom portion VLb2 of the opening pattern ML becomes equal to or smaller than the film thickness of the deposition layer D3 formed on the surface of the mask layer M located outside the opening patterns MS and ML.

That is, regarding the film thickness of the deposition layer D3, the film thicknesses gradually become smaller in the order of the film thickness TD3 of the deposition layer D3 formed on the surface of the mask layer M positioned outside the opening patterns MS and ML, the film thickness TLD3 of the deposition layer D3 formed on the bottom portion VLb2 of the opening pattern ML, and the film thickness TSD3 of the deposition layer D3 formed on the bottom portion VSb2 of the opening pattern MS.

In the deposition step S05 of the third cycle, the deposition coverage of the deposition layer D3 of the bottom portions VSb2 and VLb2 corresponding to the opening patterns MS and ML, respectively, can be controlled so as to obtain optimized deposition coverage by setting deposition conditions as described above. Here, a preferred condition for forming the deposition coverage is to shorten a processing time required for causing the deposition layer D3 having a necessary film thickness to be layered on the bottom portions VSb2 and VLb2. That is, the preferred condition for forming the deposition coverage is to increase the film-formation rate at which the deposition layer D3 is layered on the bottom portions VSb2 and VLb2.

Furthermore, in the deposition step S05 of the third cycle, the preferred condition for forming the deposition coverage is to control the deposition coverage in accordance with the etching depth and the aspect ratio. That is, as described below, the depths of the bottom portions VSb1 and VLb1 are different from the depths of the bottom portions VSb2 and VLb2, and therefore the depths of the bottom portions are changed. Even in the case in which the aspect ratio is changed depending on variation in the depths of the bottom portions as described above, it is possible to form the deposition layer D3 having a desired thickness at a predetermined film-formation rate.

Furthermore, the preferred condition for forming the deposition coverage is to improve uniformity and reliability with respect to the deposition layer D3 layered on the bottom portion VSb2 and uniformity and reliability with respect to the deposition layer D3 layered on the bottom portion VLb2.

Moreover, the deposition conditions of the deposition step S05 of the third cycle may be the same as those of at least one of the deposition step S05 of the first cycle and the deposition step S05 of the second cycle.

Figure 11:
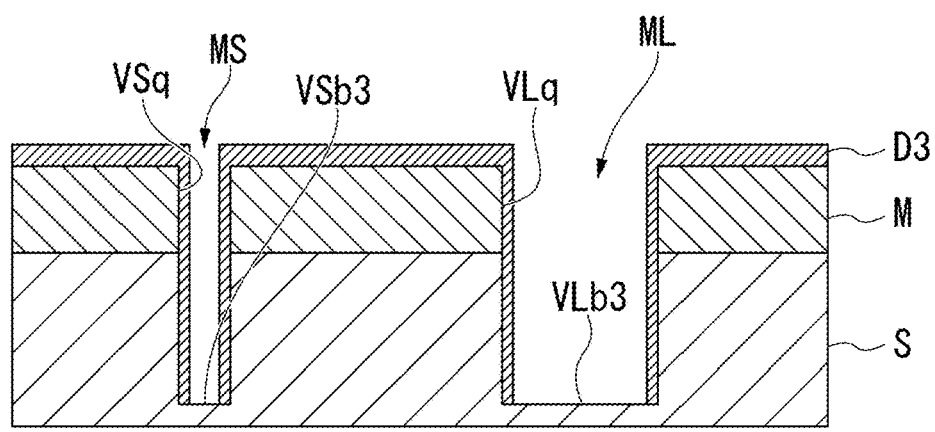
FIG. 11 is a cross-sectional view showing a step of the silicon dry etching method according to the first embodiment of the invention.

FIG. 11 is a cross-sectional view showing a step of the silicon dry etching method according to the embodiment.

In the dry-etching step S06 of the third cycle shown in FIG. 2, the bottom portions VSb2 and VLb2 corresponding to the opening patterns MS and ML, respectively, are etched by anisotropic plasma etching as shown in FIG. 11, the positions of the bottom portions VSb2 and VLb2 are lowered, and thereby the bottom portions VSb3 and VLb3 are formed.

At this time, the depths of the bottom portion VSb3 corresponding to the opening pattern MS and the bottom portion VLb3 corresponding to the opening pattern ML formed by the dry-etching step S06 of the third cycle are set to be uniform by the processing conditions of the dry-etching step S06 of the third cycle and the plasma anisotropy thereof and the difference between the film thickness of the deposition layers D3 formed by the deposition step S05.

Particularly, the film thickness TSD3 of the deposition layer D3 layered on the bottom portion VSb2 corresponding to the opening pattern MS is smaller than the film thickness TLD3 of the deposition layer D3 layered on the bottom portion VLb2 corresponding to the opening pattern ML. Moreover, the etching amount with respect to the bottom portion VSb2 corresponding to the opening pattern MS is smaller than the etching amount with respect to the bottom portion VLb2 corresponding to the opening pattern ML. Therefore, the film thickness of the deposition layer formed by the aforementioned deposition and the etching amount of the aforementioned etching are balanced, and the depth of the bottom portion VSb3 corresponding to the opening pattern MS and the depth of the bottom portion VLb3 corresponding to the opening pattern ML are uniform.

Additionally, an effect of the etching with respect to the side walls VSq and VLq corresponding to the opening patterns MS and ML, respectively, may be extremely reduced by the processing conditions of the dry-etching step S06 of the third cycle and the plasma anisotropy thereof and by the deposition layer D3. For this reason, the side walls VSq and VLq are vertical to the surface of the silicon substrate S and are on substantially the same plane. Accordingly, the side walls VSq and VLq are formed without irregularities so as to extend in the depth direction.

That is, as the recess patterns VS and VL, the bottom portions VSb3 and VLb3 are formed so as to have a uniform diameter.

Also in the dry-etching step S06 of the third cycle, the plasma-processing apparatus 10 described later is used to generate plasma with high anisotropy so as to achieve this shape. At this time, the setting conditions of the plasma-processing apparatus 10 used in the dry-etching step S06 of the third cycle are the same as those of the second cycle. That is, as described below, the frequency $\lambda 2$ of high-frequency power applied to the second electrode E2 located at the inner-periphery can be set higher than the frequency $\lambda 3$ of high-frequency power applied to the third electrode E3 located at the outer-periphery. Specifically, for example, the frequency $\lambda 2$ may be 13.65 MHz, and the frequency $\lambda 3$ may be 2 MHz.

Moreover, also in the dry-etching step S06 of the third cycle, the setting conditions of the plasma-processing apparatus 10 are the same as those of the second cycle. That is, as described below, the value of the high-frequency power of the frequency $\lambda 2$ applied to the second electrode E2 located at the inner-periphery is higher than the value of the deposition step S05 of the third cycle and is set to be the same as the value of the supply power in the ashing step S07 of the third cycle.

Moreover, also in the dry-etching step S06 of the third cycle, the setting conditions of the plasma-processing apparatus 10 are the same as those of the second cycle. Particularly, as described below, the value of the high-frequency power of the frequency $\lambda 2$ applied to the second electrode E2 located at the inner-periphery can be set to be the same as the value of the high-frequency power of the frequency $\lambda 3$ applied to the third electrode E3 located at the outer-periphery.

Also in the dry-etching step S06 of the third cycle, the setting conditions of the plasma-processing apparatus 10 are the same as those of the second cycle. That is, it is preferable to apply a bias voltage with the frequency $\lambda 1$ to the first electrode 12. The frequency $\lambda 1$ can be set lower than the frequency $\lambda 3$ of high-frequency power applied to the third electrode E3 located at the outer-periphery. The frequency $\lambda 1$ may be, for example, 400 kHz.

Furthermore, the anisotropic plasma etching of the dry-etching step S06 of the third cycle is the same as that of the second cycle. Particularly, the mixed gas of $SF_6$ and $O_2$ is decomposed by plasma, and the anisotropic etching with respect to Si is carried out. For this reason, Si is etched by the F-radical generated due to decomposition of $SF_6$ (F+Si→$SiF_4$). This etching reaction occurs in isotropic etching. In order to carry out anisotropic etching, the etching reaction with respect to the side walls VSq and VLq may be suppressed by forming a protective film that adheres to the side walls VSq and VLq.

The anisotropic plasma etching using the mixed gas of $SF_6/O_2$ in the dry-etching step S06 of the third cycle is the same as that of the second cycle. That is, the deposition layer D2 is removed from the side walls VSq and VLq corresponding to the opening patterns MS and ML, respectively, and the side walls VSq and VLq are exposed.

Here, the anisotropic plasma etching using the mixed gas of $SF_6/O_2$ in the dry-etching step S06 of the third cycle is the same as that of the second cycle. That is, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, similar to the second cycle, in the dry-etching step S06 of the third cycle, $SiF_4$ can be used as an etching gas in order to prevent lack of the etching product of $SiF_4$.

Moreover, the dry-etching step S06 of the third cycle is the same as that of the second cycle. That is, $SF_6$ or $NF_3$ is used as an etching gas, $SiF_4$ serving as a silicon compound is added to the etching gas, and $O_2$, $N_2$, $N_2O$, NO, $NO_N$, or $CO_2$ which serves as a reactant is added to the gas. Accordingly, the bottom portion can be intensively etched.

Additionally, the processing time of the dry-etching step S06 of the third cycle can be longer than the processing time of at least one of the dry-etching step S06 of the first cycle and the dry-etching step S06 of the second cycle.

Figure 12:
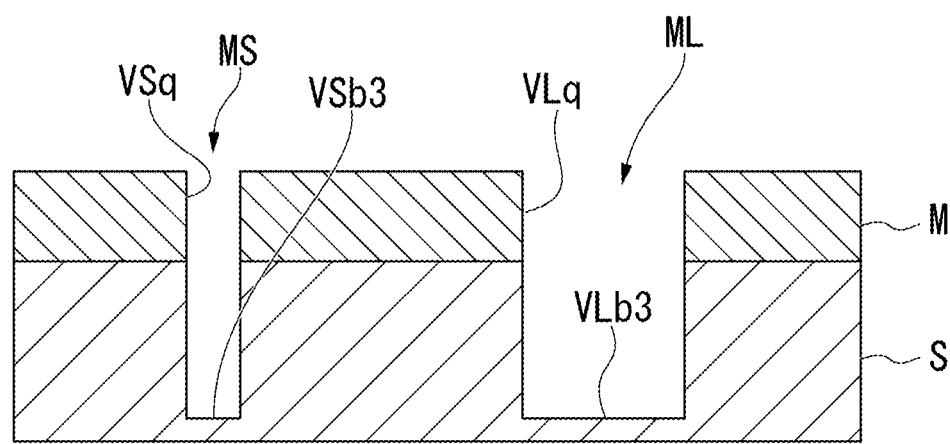
FIG. 12 is a cross-sectional view showing a step of the silicon dry etching method according to the first embodiment of the invention.

FIG. 12 is a cross-sectional view showing a step of the silicon dry etching method according to the embodiment.

In the ashing step S07 of the third cycle shown in FIG. 2, the remaining deposition layer D3 is removed after the dry-etching step S06 of the third cycle is completed as shown in FIG. 12.

Particularly, in the ashing step S07 of the third cycle, an ashing condition is set so as to reliably remove the deposition layer D3 that remains on the region close to the inner-peripheries of the opening pattern MS and the opening pattern ML of the mask layer M.

The ashing step S07 of the third cycle is the same as that of at least one of the first cycle and the second cycle. That is, after the dry-etching step S06 of the third cycle is completed, the deposition layer D3 adhered to the surface of the mask layer M, the deposition layer D3 that remains on the region close to the inner-peripheries of the opening pattern MS and the opening pattern ML of the mask layer M, and the deposition layers D3 that remain on the side walls VSq and VLq corresponding to the opening patterns MS and ML, respectively, are removed.

Furthermore, in the case in which the deposition layer D3 remains on the bottom portion VSb3 corresponding to the opening pattern MS and the deposition layer D3 remains on the bottom portion VLb3 corresponding to the opening pattern ML, the deposition layers D3 are removed.

Here, it is most important to remove the deposition layer D3 that remains at the inner-periphery position of the opening pattern MS and the deposition layer D3 that remains at the inner-periphery position of the opening pattern ML. In the case in which the deposition layer D3 remains without being removed, a next deposition layer D4 is further deposited on the remaining deposition layer D3 by carrying out the deposition step S05 of the fourth cycle in the repetitive cycles. In this case, the opening diameters (opening space) of the opening pattern MS and the opening pattern ML of the mask layer M decrease.

As described above, in the case in which the opening diameters of the opening pattern MS and the opening pattern ML of the mask layer M decrease, even where the etching with a high degree of anisotropy is carried out in the dry-etching step S06 of the fourth cycle carried out next to the third cycle, the deposition layer D2 and the deposition layer D3 inhibit the etching plasma from reaching the bottom portion VSb3 and the bottom portion VLb3. Accordingly, the etching with respect to the bottom portion VSb3 and the bottom portion VLb3 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in a state in which the deposition layer D3 does not remain at the inner-periphery position of the opening pattern MS and the deposition layer D3 does not remain at the inner-periphery position of the opening pattern ML, the deposition layer D4 is not further deposited on the remaining deposition layer D3 in the deposition step S05 of the fourth cycle carried out next to the third cycle of the repetitive cycles. For this reason, the opening diameters (opening space) of the opening pattern MS and the opening pattern ML of the mask layer M can be maintained so as to have a predetermined size.

Therefore, in the dry-etching step S06 of the fourth cycle of the repetitive cycles, as a result of carrying out the etching with a high degree of anisotropy, reach of the etching plasma to the bottom portion VSb3 and the bottom portion VLb3 is not inhibited by the deposition layer D3 and the deposition layer D4. Consequently, the etching with respect to the bottom portion VSb3 and the bottom portion VLb3 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape, and it is possible to form each of the recess patterns VS and VL with a high-aspect ratio so as to have a uniform diameter in the depth direction.

In the ashing step S07 of the third cycle, similar to at least one of the first cycle and the second cycle described above, it is necessary to generate plasma with high anisotropy in order to reliably remove the deposition layer D3 that remains at the inner-periphery positions of the opening patterns MS and ML. Therefore, also in the ashing step S07 of the third cycle, the plasma-processing apparatus 10 described later is used. At this time, the setting conditions of the plasma-processing apparatus 10 used in the ashing step S07 of the third cycle are the same as those of at least one of the first cycle and the second cycle. That is, as described below, the frequency $\lambda 2$ of high-frequency power applied to the second electrode E2 located at the inner-periphery side thereof can be set higher than the frequency $\lambda 3$ of high-frequency power applied to the third electrode E3 located at the outer-periphery side thereof. Specifically, for example, the frequency $\lambda 2$ may be 13.65 MHz, and the frequency $\lambda 3$ may be 2 MHz.

Moreover, the setting conditions of the plasma-processing apparatus 10 used in the ashing step S07 of the third cycle are the same as those of at least one of the first cycle and the second cycle. Particularly, as described below, the value of the high-frequency power of the frequency $\lambda 2$ applied to the second electrode E2 located at the inner-periphery is higher than the value of the deposition step S05 and is set to be the same as the value of the supply power in the dry-etching step S06 of the third cycle.

Moreover, the setting conditions of the plasma-processing apparatus 10 used in the ashing step S07 of the third cycle are the same as those of at least one of the first cycle and the second cycle. That is, as described below, the value of the high-frequency power of the frequency $\lambda 2$ applied to the second electrode E2 located at the inner-periphery can be set to be the same as the value of the high-frequency power of the frequency $\lambda 3$ applied to the third electrode E3 located at the outer-periphery.

Also, the setting conditions of the plasma-processing apparatus 10 used in the ashing step S07 of the third cycle are the same as those of at least one of the first cycle and the second cycle. Particularly, it is preferable to apply a bias voltage with the frequency $\lambda 1$ to the first electrode 12. The frequency $\lambda 1$ can be set lower than the frequency $\lambda 3$ of high-frequency power applied to the third electrode E3 located at the outer-periphery. The frequency $\lambda 1$ may be, for example, 400 kHz.

Additionally, the setting conditions of the plasma-processing apparatus 10 used in the ashing step S07 of the third cycle are the same as those of at least one of the first cycle and the second cycle. Particularly, it is preferable to apply the bias voltage to the first electrode 12. The power of the bias voltage of the ashing step S07 of the third cycle can be set to be equal to the power of the bias voltage of the dry-etching step S06 of the third cycle or higher than the power of the bias voltage of the dry-etching step S06 of the third cycle.

In the ashing step S07 of the third cycle, it is possible to carry out the ashing by supply of $O_2$ gas. According to the anisotropic plasma processing using the $O_2$ gas, the deposition layer D3 is reliably removed and the side walls VSq and VLq are exposed at the portions close to the inner-peripheries of the opening patterns MS and ML, and the side walls VSq and VLq corresponding to the opening patterns MS and ML, respectively. At the same time, although ashing is carried out by supply of $O_2$ gas in the ashing step S07 of the third cycle, since the mask layer M is formed of a $SiO_2$ film, a SiN film, a metal film (metal or the like), the mask layer M is not removed by the $O_2$ plasma.

In the silicon dry etching method according to the embodiment, the deposition step S05, the dry-etching step S06, and the ashing step S07 serve as one process cycle as shown in FIG. 2, and the process cycle is repetitively carried out. In this way, the depths of the recess patterns VS and VL become further longer.

Next, the fourth cycle will be described.

Figure 13:
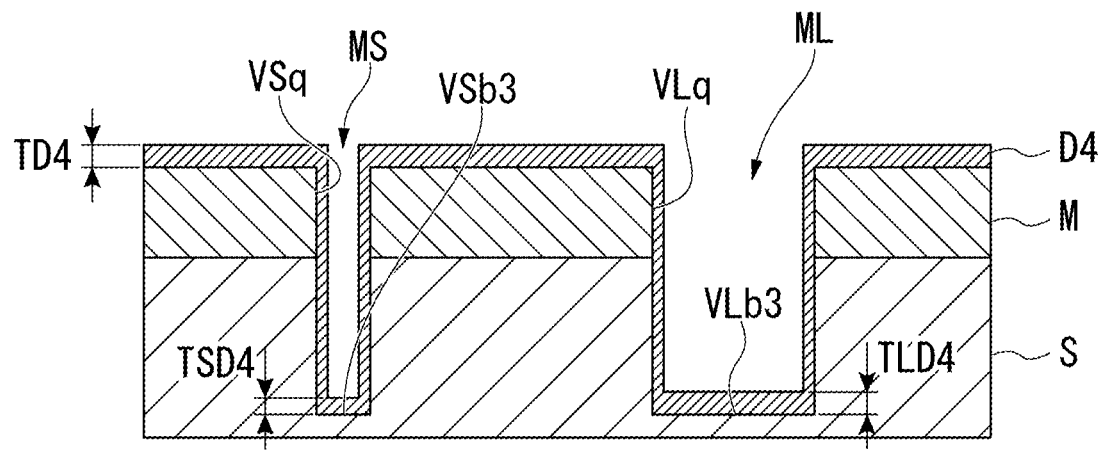
FIG. 13 is a cross-sectional view showing a step of the silicon dry etching method according to the first embodiment of the invention.

FIG. 13 is a cross-sectional view showing a step of the silicon dry etching method according to the embodiment.

In the deposition step S05 shown in FIG. 2 of the fourth cycle, a deposition layer D4 made of a polymer such as fluorocarbon or the like is formed on the entire surface of the silicon substrate S by anisotropic plasma processing as shown in FIG. 13. Therefore, side walls of the recess pattern VS and the recess pattern VL can be protected from being etched by the dry-etching step S06 carried out after the deposition step S05 of the fourth cycle.

The deposition layer D4 is formed in order to protect the side walls VSq and VLq of the recess patterns VS and VL from being etched, respectively, and in order to limitedly carry out etching with respect to the bottom portions VSb3 and VLb3 of the recess patterns VS and VL, respectively. Consequently, the vertical side walls VSq and VLq are obtained by carrying out the etching using a fluorine compound in the dry-etching step S06 carried out after the deposition step S05 of the fourth cycle.

The deposition layer D4 is layered (coated) on the surface of the mask layer M and the bottom portions VSb3 and VLb3 of the recess patterns VS and VL. Although the deposition layer D4 coated on the side walls VSq and VLq of the recess patterns VS and VL, respectively, is shown in FIG. 13, practically, the deposition layer D4 is almost not formed on the side walls VSq and VLq.

The deposition step S05 of the fourth cycle is the same as that of the third cycle. That is, an anisotropic plasma processing is carried out using a fluorocarbon gas such as $CHF_3$, $C_2F_6$, $C_2F_4$, $C_4F_8$, or the like. In the deposition step S05, the plasma-processing apparatus 10 described later is used to generate plasma with high anisotropy.

In the deposition step S05 of the fourth cycle, in the plasma-processing apparatus 10, as described below, the frequency λ2 of high-frequency power applied to the second electrode E2 located at the inner-periphery thereof can be set higher than the frequency λ3 of high-frequency power applied to the third electrode E3 located at the outer-periphery thereof. Specifically, for example, the frequency λ2 may be 13.65 MHz, and the frequency λ3 may be 2 MHz.

At this time, the setting conditions of the plasma-processing apparatus 10 may be the same as those of the deposition step S05 of at least one of the first cycle to the third cycle.

Additionally, in the plasma-processing apparatus 10 in the deposition step S05 of the fourth cycle, as described below, the frequency λ2 of the value of the high-frequency power applied to the second electrode E2 located at the inner-periphery can be set lower than the values of the power of the dry-etching step S06 and the ashing step S07 described later. Furthermore, in the plasma-processing apparatus 10, a bias voltage may not be applied to a first electrode 12.

In the deposition step S05 of the fourth cycle, the process is carried out in an atmosphere having a predetermined pressure. Moreover, in the deposition step S05 of the fourth cycle, the deposition conditions can be set to be the same as those of the deposition step S05 of at least one of the first cycle to the third cycle.

The film thickness of the deposition layer D4 formed by the deposition step S05 of the fourth cycle is the same as that of the deposition step S05 of the first cycle to the third cycle. That is, the film thickness of the deposition layer D4 formed on the bottom portion VLb3 corresponding to the opening pattern ML having the large diameter becomes larger than the film thickness of the deposition layer D4 formed on the bottom portion VSb3 corresponding to the opening pattern MS having the small diameter. Note that, the film thickness of the deposition layer D4 formed on the bottom portion VLb3 of the opening pattern ML becomes equal to or smaller than the film thickness of the deposition layer D4 formed on the surface of the mask layer M located outside the opening patterns MS and ML.

That is, regarding the film thickness of the deposition layer D4, the film thicknesses gradually become smaller in the order of the film thickness TD4 of the deposition layer D4 formed on the surface of the mask layer M positioned outside the opening patterns MS and ML, the film thickness TLD4 of the deposition layer D4 formed on the bottom portion VLb3 of the opening pattern ML, and the film thickness TSD4 of the deposition layer D4 formed on the bottom portion VSb3 of the opening pattern MS.

In the deposition step S05 of the fourth cycle, the deposition coverage of the deposition layer D4 of the bottom portions VSb3 and VLb3 corresponding to the opening patterns MS and ML, respectively, can be controlled so as to obtain optimized deposition coverage by setting deposition conditions as described above. Here, a preferred condition for forming the deposition coverage is to shorten a processing time required for causing the deposition layer D4 having a necessary film thickness to be layered on the bottom portions VSb3 and VLb3. That is, the preferred condition for forming the deposition coverage is to increase the film-formation rate at which the deposition layer D4 is layered on the bottom portions VSb3 and VLb3.

Furthermore, in the deposition step S05 of the fourth cycle, the preferred condition for forming the deposition coverage is to control the deposition coverage in accordance with the etching depth and the aspect ratio. That is, as described below, the depths of the bottom portions VSb2 and VLb2 are different from the depths of the bottom portions VSb3 and VLb3, and therefore the depths of the bottom portions are changed. Even in the case in which the aspect ratio is changed depending on variation in the depths of the bottom portions as described above, it is possible to form the deposition layer D4 having a desired thickness at a predetermined film-formation rate.

Furthermore, the preferred condition for forming the deposition coverage is to improve uniformity and reliability with respect to the deposition layer D4 layered on the bottom portion VSb3 and uniformity and reliability with respect to the deposition layer D4 layered on the bottom portion VLb3.

Next, in the dry-etching step S06 of the fourth cycle shown in FIG. 2, the bottom portions VSb2 and VLb2 corresponding to the opening patterns MS and ML, respectively, are etched by anisotropic plasma etching, the positions of the bottom portions VSb2 and VLb2 are lowered, and thereby the bottom portions VSb3 and VLb3 are formed.

Next, in the ashing step S07 of the fourth cycle shown in FIG. 2, the remaining deposition layer D4 is removed.

Consequently, as shown in FIG. 1, it is possible to form the recess pattern VS having the diameter φS and the recess pattern VL having the diameter φL on the surface of the silicon substrate S so as to have the same depth.

Furthermore, as shown in FIG. 1, the silicon dry etching method according to the embodiment is completed by removing the mask layer M as needed.

In the silicon dry etching method according to the embodiment, as shown in FIG. 2, the deposition step S05, the dry-etching step S06, and the ashing step S07 serve as one process cycle, and the process cycle is repetitively carried out. Accordingly, even in the case in which the recess patterns VS and VL have the diameters different from each other, it is possible to form the recess patterns VS and VL so as to have the same depths as each other. That is, it is possible to form the recess patterns VS and VL with a high-aspect ratio.

Note that, as long as the number of repetitive cycles is one or more, the number of repetitive cycle is optionally selected. Moreover, the ashing step S07 may not be carried out for each cycle. It is possible to determine whether or not it is necessary to carry out the ashing step S07 depending on the amount of the deposition layer remaining on the inner-peripheries of the opening patterns MS and ML for each cycle.

Next, the plasma-processing apparatus used in the silicon dry etching method according to the embodiment will be described with reference to the drawings.

Figure 14:
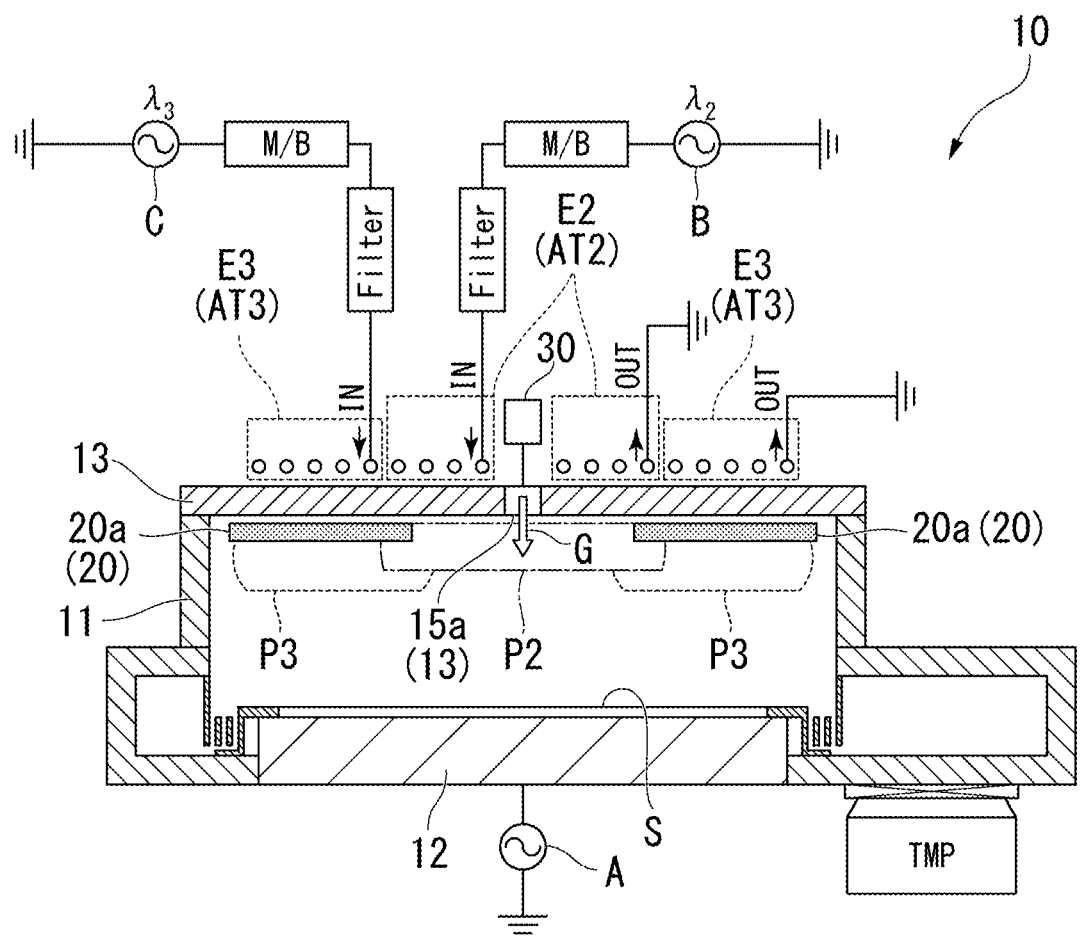
FIG. 14 is a schematic cross-sectional view showing an apparatus used in the silicon dry etching method according to the first embodiment of the invention.
Figure 15:
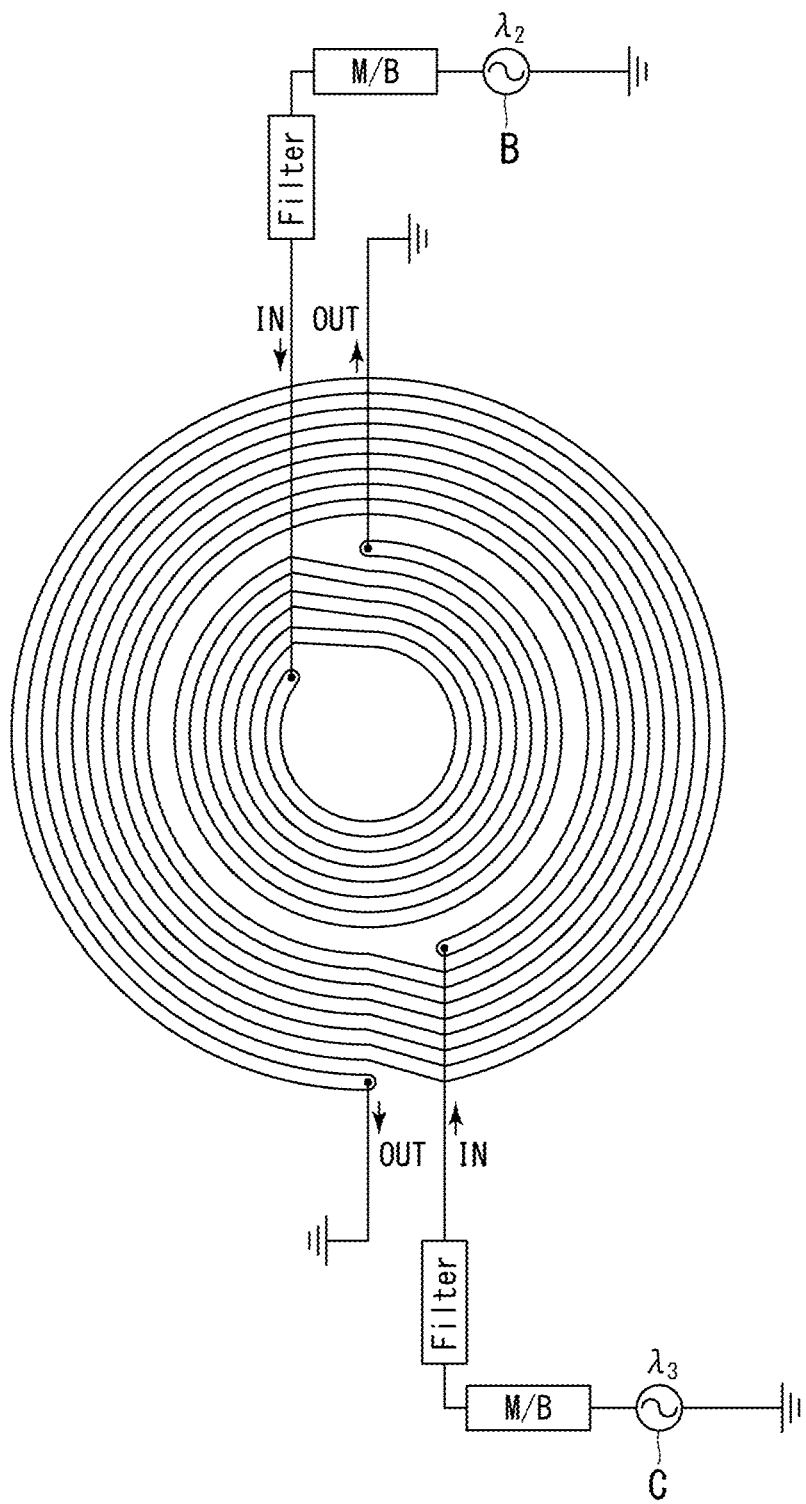
FIG. 15 is a view showing two spiral electrodes disposed at the inner-periphery and the outer-periphery and a power source that outputs powers of frequencies different from each other to the two spiral electrodes in the apparatus shown in FIG. 14, and is a plan view for explanation of a position at which the spiral electrodes are connected to the power source.
Figure 16:
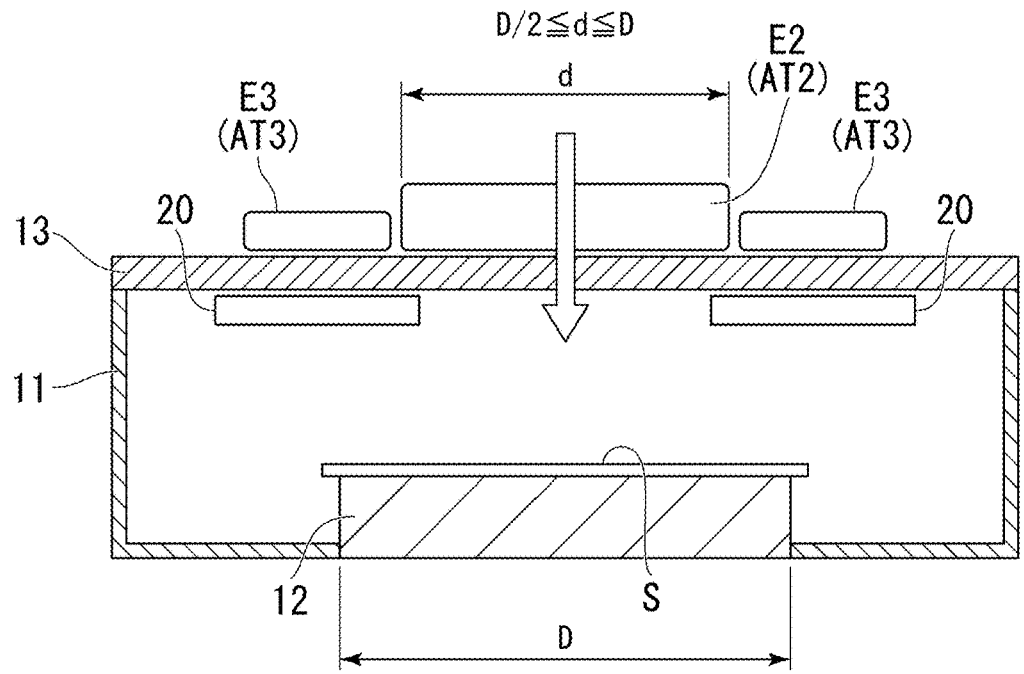
FIG. 16 is a cross-sectional view showing a relationship of a first electrode (outer diameter D) and a second electrode (outer diameter d) in the apparatus shown in FIG. 14.

FIG. 14 is a schematic cross-sectional view showing the plasma-processing apparatus used in the silicon dry etching method according to the embodiment. FIG. 15 is a plan view showing two spiral electrodes disposed at the inner-periphery and the outer-periphery and a power source that outputs powers of frequencies different from each other to the two spiral electrodes in the apparatus shown in FIG. 14. FIG. 15 is a plan view for explanation of a position at which the spiral electrodes are connected to the power source. FIG. 16 is a cross-sectional view showing a relationship of a first electrode (outer diameter D) and a second electrode (outer diameter d) in the apparatus shown in FIG. 14. In FIG. 14, reference numeral 10 indicates a plasma-processing apparatus.

The plasma-processing apparatus 10 according to the embodiment is configured to generate dual frequency ICP (Inductive Coupled Plasma). As shown in FIG. 14, the plasma-processing apparatus 10 includes, for example, a chamber 11 in which the pressure thereinside can be reduced by an evacuation device TMP such as a vacuum pump. The plasma-processing apparatus is an apparatus that carries out plasma processing with respect to the silicon substrate S (target object) in the chamber 11.

The plasma-processing apparatus 10 includes, for example, an upper lid 13, a solid source 20*a* (20), a first electrode 12, a second electrode E2 (electrode, antenna AT2), a third electrode E3 (electrode, antenna AT3). The upper lid 13 is disposed at the upper end of the chamber 11. A gas introduction hole 15 is formed at a center portion 15*a* (13) of the upper lid 13. A gas introduction device 30 is connected to the gas introduction hole via a pipe or the like. The solid source 20*a* is disposed in the chamber 11 so as to face the upper lid 13. The second electrode E2 and the third electrode E3 are located above the upper lid 13 outside the chamber 11. The second electrode E2 is disposed at the inside region of the upper lid 13. The third electrode E3 is disposed at the outside region (the outer-periphery side) of the upper lid 13.

The solid source 20*a* is disposed inside the chamber 11 of the plasma-processing apparatus 10. When viewed from the vertical direction of the upper lid 13, the third electrode E3 is disposed so as to overlap the solid source 20*a*. Note that, the solid source 20*a* needs to be disposed to overlap the third electrode E3 so as to cover at least part of the third electrode E3. The solid source 20*a* is provided separately from the upper lid 13 of the chamber 11. The material used to form the solid source 20 includes, for example, silicon oxide.

The frequency of the power applied to the third electrode E3 is lower than the frequency of the power applied to the second electrode E2. In other words, the frequency of the power applied to the second electrode E2 is higher than the frequency of the power applied to the third electrode E3. That is, regarding the second frequency $\lambda 2$ and the third frequency $\lambda 3$, the plasma-processing apparatus 10 has the relationship of $\lambda 2 > \lambda 3$.

The gas introduction device 30 is disposed at the center portion of the upper lid 13.

The first electrode 12 disposed inside the chamber 11 of the plasma-processing apparatus 10 is a flat plate-shaped electrode. The silicon substrate S is to be mounted on the top surface of the first electrode 12. Therefore, the first electrode 12 functions as a support part that supports the silicon substrate S. Additionally, the first electrode 12 may be referred to as a substrate stage.

The plasma-processing apparatus 10 includes a high-frequency power source A (first high-frequency power source) electrically connected to the first electrode 12, a high-frequency power source B (second high-frequency power source) electrically connected to the spiral-shaped second electrode E2, and a high-frequency power source C (third high-frequency power source) electrically connected to the spiral-shaped third electrode E3.

The high-frequency power source A can apply a bias voltage of the frequency (first frequency) $\lambda 1$ to the first electrode 12.

Both the spiral-shaped second electrode E2 and the spiral-shaped third electrode E3 are disposed outside of the chamber 11 and are disposed so as to face the first electrode 12 and sandwich a quartz plate forming the upper lid 13 of the chamber 11 therebetween. The spiral-shaped second electrode E2 is disposed along the upper lid 13 and at the center portion of the upper lid. The spiral-shaped third electrode E3 is disposed along the upper lid 13 and at the outer-periphery outside the second electrode E2.

The high-frequency power source B can apply an alternating voltage of the frequency (second frequency) $\lambda 2$ to the second electrode E2 (FIG. 14). The second electrode E2 has a first portion and a second portion. The first portion is disposed at the inner-peripheral end of the spiral-shaped second electrode E2. The high-frequency power output from the second high-frequency power source B is applied to the first portion. The second portion is disposed at the outer-peripheral end of the spiral-shaped second electrode E2. The second portion is connected to the ground (FIG. 15).

The high-frequency power source C can apply an alternating voltage of the frequency (third frequency) $\lambda 3$ to the third electrode E3 (FIG. 14). The third electrode E3 has a third portion and a fourth portion. The third portion is disposed at the inner-peripheral end of the spiral-shaped third electrode E3. The high-frequency power output from the third high-frequency power source C is applied to the third portion. The fourth portion is disposed at the outer-peripheral end of the spiral-shaped third electrode E3. The fourth portion is connected to the ground (FIG. 15).

The second high-frequency power source B applies the alternating voltage of the second frequency $\lambda 2$ to the second electrode E2. The third high-frequency power source C applies the alternating voltage of the third frequency $\lambda 3$ to the third electrode E3.

In the plasma-processing apparatus 10, the gas introduction device 30 introduces a processing gas G containing fluorine (F) into the inside of the chamber 11 through the gas introduction hole formed at the upper lid 13.

The plasma-processing apparatus 10 includes the solid source 20 for sputtering. The solid source 20 is disposed closer to the upper lid 13 than the first electrode 12 inside the chamber 11. The solid source 20 is located so as to face the first electrode 12. Particularly, the solid source 20 and the third electrode E3 are provided in the plasma-processing apparatus 10 such that the region at which the solid source 20 is disposed overlaps the region (outer region of the upper lid 13) at which the third electrode E3 is disposed when viewed from the vertical direction of the upper lid 13.

Plasma P2 generated due to the second electrode E2 and plasma P3 generated due to the third electrode E3 are generated in a space (region) close to the upper lid 13 inside the chamber 11 of the plasma-processing apparatus 10 having the aforementioned configuration. In the plasma-processing apparatus 10, since the solid source 20 and the third electrode E3 are provided such that the region at which the solid source 20 is disposed overlaps the region at which the third electrode E3 is disposed, the solid source 20 is mainly sputtered by the plasma P3. Since the solid source 20 includes silicon oxide, for example, an oxygen element is sequentially introduced into the plasma (particularly, the plasma P3) from the solid source 20. Accordingly, in the plasma (particularly, the plasma P3), the oxygen element is not lacking.

Here, in order to control the relationship of the emission spectral characteristics of the oxygen element (O) and the fluorine element (F) and the ratio O/F of the oxygen element (O) to the fluorine element (F) to be in a predetermined state, the source power of the low frequency (2 MHz) can be controlled to be in a range of 0 W to 3 kW in a state in which the source power of the high frequency (13.56 MHz) is fixed to 2 kW.

In the plasma-processing apparatus 10, as shown in FIG. 16, the relationship of the first electrode 12 (outer diameter D) on which the silicon substrate S is mounted and the second electrode E2 (outer diameter d) disposed at the position at which the second electrode does not overlap the solid source 20 (disposed at the inside region of the upper lid 13) is set.

In the case in which the diameter d of the second electrode (antenna AT2) is less than or equal to half of the diameter D of the first electrode 12 that supports the silicon substrate S, the plasma density at the outer-periphery of the first electrode 12 is lowered, and the generation amount of the F-radical is significantly lowered. Consequently, the outer-periphery of the silicon substrate S cannot be etched similarly to the case of etching the center region of the silicon substrate S.

In the case in which the diameter d of the second electrode (antenna AT2) is 1.3 or more times the diameter D of the first electrode 12 that supports the silicon substrate S, even where the low-frequency power is applied to the third electrode E3 (antenna AT3) and the oxygen element is supplied to the silicon substrate S from the solid source 20, since the solid source 20 is away from the silicon substrate S, the etching effect does not affect the outer-periphery of the silicon substrate S.

Therefore, in the plasma-processing apparatus 10 according to the embodiment, when the oxygen element is supplied to the silicon substrate S from the solid source 20, it is preferable to satisfy the relational expression D/2≤d≤D.

In the silicon dry etching method according to the embodiment, the etching stop effect due to deposition of the deposition layers D1 to D4 on the recess portions of the recess patterns is utilized. As a result, after the dry etching process is carried out, it is possible to reduce a difference between the depths of the recess patterns VS and VL such as a hole, a trench, or the like which have the diameters different from each other (φS, φL, or the like).

Furthermore, by adding the ashing step S07 of removing the deposition layers D1 to D4 to the repetitive cycle of carrying out the deposition step S05 of forming the deposition layer and the dry-etching step S06 of etching the deposition layer, the deposition layer is removed for each cycle. Consequently, when the etching is carried out, the deposition layers D1 to D4 which are made of a $C_xF_y$-based polymer and are adhered to the side walls VSq and VLq corresponding to the regions of the opening patterns MS and ML are removed. Furthermore, in the dry-etching step S06, the plasma-processing apparatus 10 uses dual frequency ICP (for example, 13.56 MHz, 2 MHz). Therefore, it is possible to continuously form the $SiO_x$ protective film on the side walls VSq and VLq by actively ionizing the added $O_2$ gas.

Thus, the overhanging of the deposition layer can be prevented, that is, the deposition layers D1 to D4 adhered to the inner-peripheries of the openings of the opening patterns MS and ML can be prevented from protruding from the side walls VSq and VLq toward the centers of the openings of the opening patterns MS and ML, respectively. Because of this, the opening regions of the opening patterns MS and ML do not become narrow, and the etching plasma sufficiently reaches the bottom portions VSb and VLb located close to the side walls VSq and VLq, respectively. That is, it is possible to ensure the surface areas of the bottom portions VSb and VLb, and in accordance with this, the shape obtained by etching the silicon is prevented from being a tapered shape.

Accordingly, while maintaining the vertical shapes of the side walls VSq and VLq with respect to the substrate surface of the silicon substrate S, a difference between the depths of the recess patterns VS and VL (a hole, a trench, or the like) having the diameters different from each other can be suppressed from being generated after the etching treatment is carried out. For this reason, the embodiment can provide the dry etching method that can form the recess patterns while suppressing a difference between the depths of the recess patterns (a hole, a trench, or the like) having the diameters different from each other from being generated after the etching treatment is carried out.

In the silicon dry etching method according to the embodiment, the deposition layers D1 to D4 adhered to the regions close to the inner-peripheries of the opening patterns MS and ML of the mask layer M are removed by the ashing step S07. In this state, it is possible to form the recess patterns VS and VL by carrying out the dry-etching step S06. Therefore, as a result of using the deposition layers D1 to D4 adhered to the regions close to the inner-peripheries of the opening patterns MS and ML of the mask layer M, a tapered shape such that the widths of the etched recess patterns become narrower with an increase in the etching depths of the recess patterns VS and VL can be prevented from being generated.

Additionally, in the deposition step S05, the thicknesses of the deposition layers D1 to D4 adhered to the bottom portions VLb to VLb3 of the recess pattern VL having the large opening pattern ML become large. At the same time, in the deposition step S05, the thicknesses of the deposition layers D1 to D4 adhered to the bottom portions VSb to VSb3 of the recess pattern VS having the small opening pattern MS become small. Accordingly, even in the case of simultaneously forming the opening patterns MS and ML having the diameters different from each other, the depths of the recess patterns VS and VL are equal to each other, and it is possible to prevent the RIE-lag from being generated.

That is, the silicon dry etching method according to the embodiment of the invention utilizes the etching stop effect due to the deposition layer formed by the deposition step. Because of this, it is possible to reduce the difference between the depths of the recess patterns VS and VL after the recess patterns (a hole, a trench, or the like) having sizes (diameters) different from each other are formed on the silicon substrate S.

In the silicon dry etching method according to the embodiment, the deposition layers D1 to D4 adhered to the regions close to the inner-peripheries of the opening patterns MS and ML of the mask layer M are removed. Therefore, it is possible to form the bottom portions VSb to VSb3 and VLb to VLb3 of the recess patterns such that each diameter of the recess portion is uniform in the direction of the etching depth without depending on the etching depths of the recess patterns VS and VL.

Moreover, in the cycle of repetitively carrying out the deposition step S05 (deposition) of forming the deposition layers D1 to D4 and the dry-etching step S06, the ashing step S07 is carried out after the cycle is carried out. As described above, by adding the ashing step S07 to above-described process cycle, it is possible to remove the deposition layer (deposition) not necessary for each cycle.

In a state in which the unnecessary deposition layer that remains on the region close to the inner-periphery of the opening pattern of the mask layer M is removed, it is possible to form a new and necessary deposition layer on the bottom portions VSb to VSb3 and VLb to VLb3 of the recess patterns VS and VL.

In a state in which the deposition layer adhered to the region close to the inner-periphery of the opening patterns MS and ML of the mask layer M is removed, it is possible to form a new and necessary deposition layer on the bottom portions VSb to VSb3, VLb to VLb3, or the like of the recess patterns VS and VL. As a result of carrying out the dry-etching step S06 in this state, in the etching treatment of the recess patterns VS and VL, it is possible to form the bottom portion of the recess pattern such that the diameter of the recess portion is uniform in the direction of the etching depth without depending on the etching depth.

The ashing step S07, the deposition step S05, the dry-etching step S06 are carried out in the same chamber 11. Therefore, the dry etching can be carried out as an in-situ process in a state in which the deposition layers D1 to D4 adhered to the region close to the inner-periphery of the opening patterns MS and ML of the mask layer M are removed.

Accordingly, superfluous processes are not necessary, while extremely reducing an effect of interference with respect to the processes, and it is possible to form the recess patterns having the bottom portions VSb to VSb3 maintaining the diameter φS of the recess portion in the direction of the etching depth without depending on the etching depth of the recess pattern VS. Similarly, it is possible to form the recess patterns having the bottom portions VLb to VLb3 maintaining the diameter φL of the recess portion in the direction of the etching depth without depending on the etching depth of the recess pattern VL.

Accordingly, a tapered shape such that the width of the etched recess pattern becomes narrower with an increase in the etching depth of the recess pattern can be prevented from being generated. At the same time, it is possible to carry out the above-mentioned process such that the side wall of the recess pattern has a predetermined shape, for example, a shape vertical to the surface of the silicon substrate.

In the ashing step S07, it is possible to re-form a so-called protective film. Therefore, it is possible to carry out the ashing while maintaining a protection state due to the formation of the oxide film on the side walls VSq and VLq of the recess patterns VS and VL in the dry-etching step S06, respectively.

Accordingly, while reducing an effect of the etching with respect to the side walls VSq and VLq of the recess patterns VS and VL, respectively, it is possible to carry out the above-mentioned process such that the side walls VSq and VLq of the recess patterns VS and VL, respectively, have a predetermined shape, for example, a shape vertical to the surface of the silicon substrate S.

Furthermore, the dual frequency ICP prompts the $O_2$ gas serving as an introduction gas to ionize and it is possible to achieve a high ashing rate.

As the plasma-processing apparatus 10 carries out the ashing step S07, the deposition step S05, and the dry-etching step S06, it is possible to carry out anisotropic plasma processing having anisotropy in the direction of forming the recess patterns VS and VL.

Consequently, while reducing an effect of the etching with respect to the side walls VSq and VLq of the recess patterns VS and VL, respectively, it is possible to carry out the dry etching process such that the recess patterns VS and VL each have a predetermined shape such that the diameters thereof are constant in the direction of the etching depth.

Therefore, a tapered shape such that the width of the etched recess pattern becomes narrower with an increase in the etching depths of the recess patterns VS and VL can be prevented from being generated. At the same time, it is possible to carry out the above-mentioned process such that the side walls VSq and VLq of the recess patterns VS and VL, respectively, have the shapes vertical to the surface of the silicon substrate S and obtain predetermined shapes such that the diameters of the recess patterns VS and VL are constant in the direction of the etching depths.

Because of this, even in the case of simultaneously forming the opening pattern MS and the opening pattern ML having the diameter φS and the diameter φL which are different from each other, respectively, and simultaneously forming the recess patterns VS and VL, the depths of the recess patterns VS and VL are equal to each other, and it is possible to prevent the RIE-lag from being generated.

Hereinbelow, a silicon dry etching method according to a second embodiment of the invention will be described with reference to the drawings.

Figure 17:
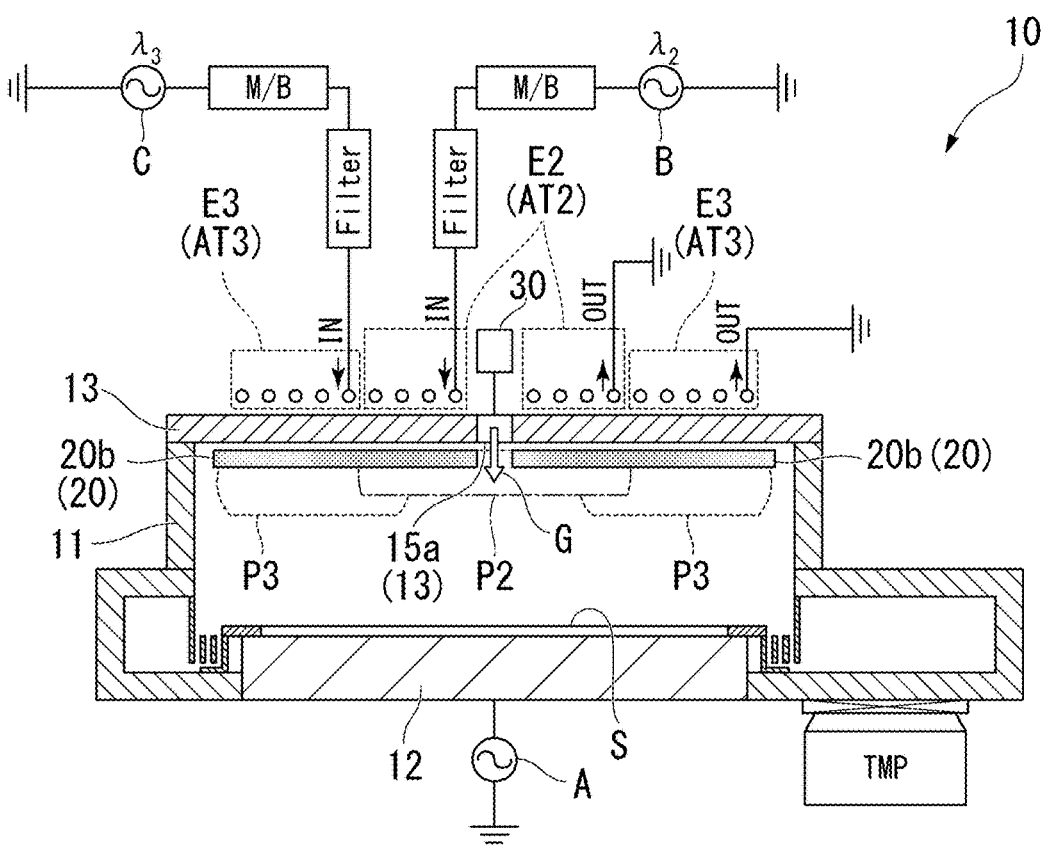
FIG. 17 is a manufacturing apparatus used in a silicon dry etching method according to a second embodiment of the invention.

FIG. 17 is a schematic cross-sectional view showing a plasma-processing apparatus that carries out a process in the embodiment. The embodiment is different from the above-described first embodiment in the plasma-processing apparatus. Identical reference numerals are used for the elements which correspond to those of the above-described first embodiment, and the explanations thereof are omitted.

In the plasma-processing apparatus 10 according to the embodiment, as shown in FIG. 17, the gas introduction device 30 is connected to the center portion 15a (13) of the upper lid 13. The region at which the solid source 20b (20) is disposed is located so as to overlap the two electrodes (the second electrode E2 and the third electrode E3) when viewed from the vertical direction of the upper lid 13.

That is, in the chamber 11 of the plasma-processing apparatus 10 having the configuration shown in FIG. 17, the region at which the solid source 20b is disposed is located so as to overlap the second electrode E2 and the third electrode E3. Furthermore, the solid source 20b is positioned so as to cover the second electrode E2 and the third electrode E3 when viewed from the direction from the first electrode 12 to the upper lid 13. In the chamber 11, the solid source 20b is provided separately from the upper lid 13 of the chamber 11.

With this configuration, the solid source 20b (20) of the plasma-processing apparatus shown in FIG. 17 is preferentially sputtered by the plasma P3 (low-frequency plasma) generated due to the third electrode E3. Accordingly, the oxygen element is supplied to the silicon substrate S serving as a target object such that the oxygen element increases in the radial direction of the silicon substrate S.

Therefore, even in the plasma-processing apparatus shown in FIG. 17, similar to the plasma-processing apparatus shown in FIG. 14, it is possible to increase the degree of anisotropy of the plasma processing on the entire area of the silicon substrate S such as both the center region and the outer-periphery region of the silicon substrate. The shape of the side surface of the recess pattern formed on the silicon substrate is maintained in a substantially straight shape in the depth direction of the recess pattern.

Hereinbelow, a silicon dry etching method according to a third embodiment of the invention will be described with reference to the drawings.

Figure 18:
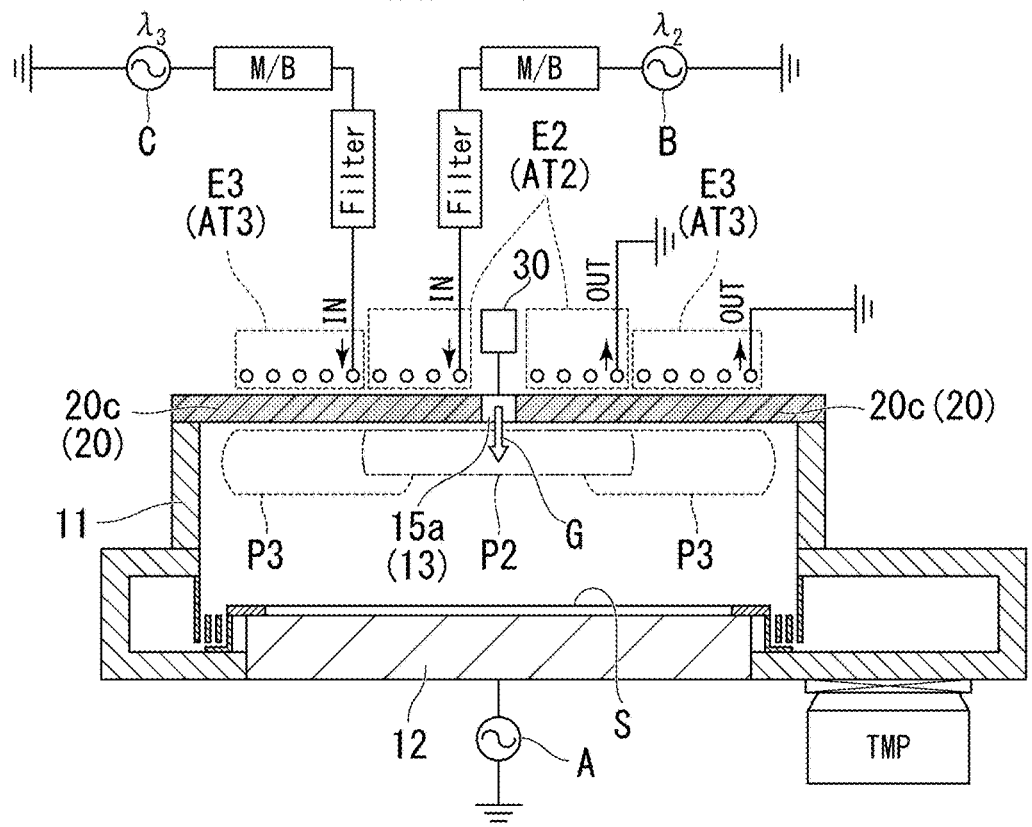
FIG. 18 is a manufacturing apparatus used in a silicon dry etching method according to a third embodiment of the invention.

FIG. 18 is a schematic cross-sectional view showing a plasma-processing apparatus that carries out a process in the embodiment. The embodiment is different from the above-described second embodiment in that the upper lid connected to the chamber 11 is formed of a solid source 20c (20). Identical reference numerals are used for the elements which correspond to those of the above-described first embodiment, and the explanations thereof are omitted.

In the plasma-processing apparatus 10 according to the embodiment, as shown in FIG. 18, it is possible to obtain the same actions and effects as those of the plasma-processing apparatus shown in FIG. 17. In addition to this, in the plasma-processing apparatus shown in FIG. 18, the upper lid connected to the chamber 11 functions as a solid source. Consequently, a structure for holding a solid source in the chamber is not necessary. Moreover, since the upper lid connected to the chamber 11 is formed of a solid source, in a state in which the plasmas P2 and P3 generated inside the chamber are electrically discharged can be further stabilized.

Therefore, even in the plasma-processing apparatus shown in FIG. 18, similar to the plasma-processing apparatus shown in FIG. 14, the shape of the side surface of the recess pattern formed on the silicon substrate is maintained in a substantially straight shape in the depth direction of the recess pattern on the entire area of the silicon substrate S such as both the center region and the outer-periphery region of the silicon substrate.

Hereinbelow, a silicon dry etching method according to a fourth embodiment of the invention will be described with reference to the drawings.

Figure 19:
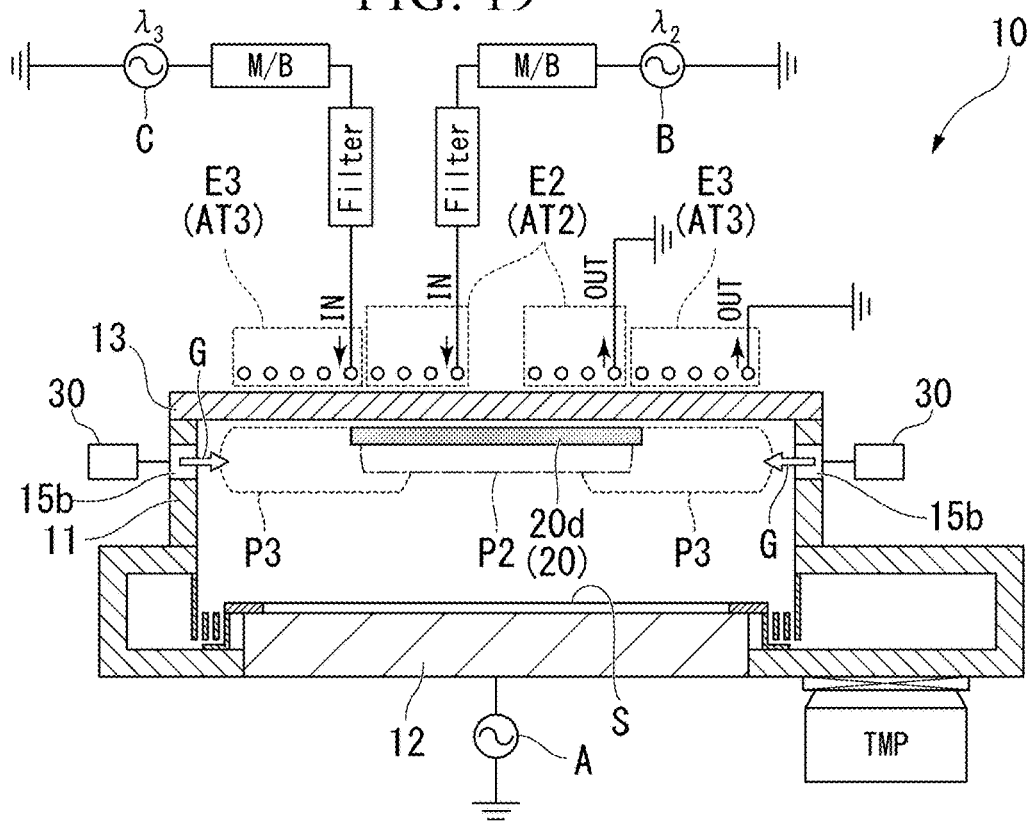
FIG. 19 is a manufacturing apparatus used in a silicon dry etching method according to a fourth embodiment of the invention.

FIG. 19 is a schematic cross-sectional view showing a plasma-processing apparatus that carries out a process in the embodiment. The embodiment is different from the above-described first embodiment in arrangement of the gas introduction device 30 and a solid source 20e (20). Identical reference numerals are used for the elements which correspond to those of the above-described first embodiment, and the explanations thereof are omitted.

In the plasma-processing apparatus 10 according to the embodiment, as shown in FIG. 19, the gas introduction device 30 is connected to a side wall portion 15b (11) of the chamber 11. The region at which a solid source 20d (20) is disposed is located so as to overlap an inside electrode (second electrode E2) when viewed from the vertical direction of the upper lid 13.

In the plasma-processing apparatus 10 according to the embodiment, the frequency λ2 of the power applied to the second electrode E2 is lower than the frequency λ3 of the power applied to the third electrode E3. Particularly, in the plasma-processing apparatus 10 shown in FIG. 19, the second frequency λ2 and the third frequency λ3 have the relationship of λ2<λ3. The gas introduction device 30 is connected to the side wall portion 15b (11) of the chamber 11.

In the case in which the gas introduction device 30 is disposed on the side wall portion 15b (11) of the chamber 11 in the plasma-processing apparatus 10 shown in FIG. 14, there is a tendency that a defect occurs at the center region of the silicon substrate S. Because of this, in the plasma-processing apparatus 10 according to the embodiment, as shown in FIG. 19, the solid source 20d (20) is disposed at the position to overlap an inside electrode (second electrode E2).

Accordingly, the action and the effect which are obtained on the outer-periphery of the silicon substrate S in the plasma-processing apparatus shown in FIG. 14 can be obtained on the center region of the silicon substrate S in the plasma-processing apparatus shown in FIG. 19.

Therefore, even in the plasma-processing apparatus shown in FIG. 19, similar to the plasma-processing apparatus shown in FIG. 14, the shape of the side surface of the recess pattern formed on the silicon substrate is maintained in a substantially straight shape in the depth direction of the recess pattern on the entire area of the silicon substrate S such as both the center region and the outer-periphery region of the silicon substrate.

Hereinbelow, a silicon dry etching method according to a fifth embodiment of the invention will be described with reference to the drawings.

Figure 20:
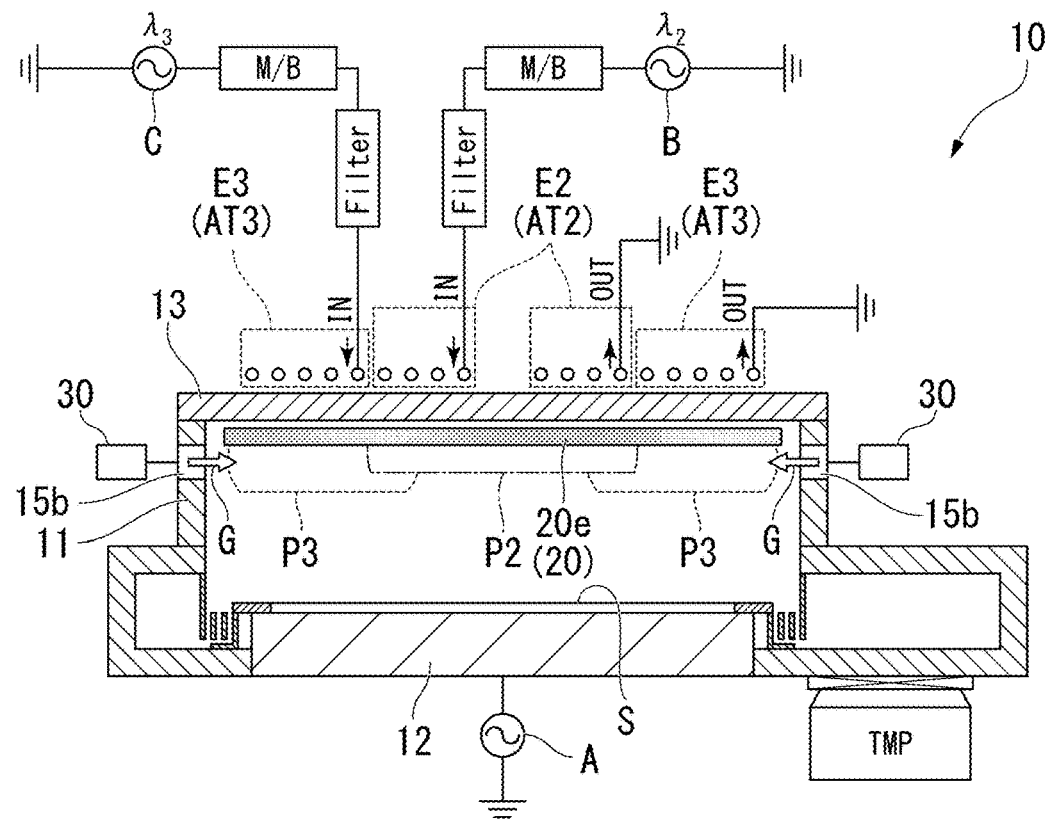
FIG. 20 is a manufacturing apparatus used in a silicon dry etching method according to a fifth embodiment of the invention.

FIG. 20 is a schematic cross-sectional view showing a plasma-processing apparatus that carries out a process in the embodiment. The embodiment is different from the above-described fourth embodiment in arrangement of the gas introduction device 30 and the solid source 20e (20). Identical reference numerals are used for the elements which correspond to those of the above-described first embodiment, and the explanations thereof are omitted.

In the plasma-processing apparatus 10 according to the embodiment, as shown in FIG. 20, the gas introduction device 30 is connected to a side wall portion 15b (11) of the chamber 11. The region at which the solid source 20e (20) is disposed is located so as to overlap the two electrodes (the second electrode E2 and the third electrode E3) when viewed from the vertical direction of the upper lid 13.

That is, in the chamber 11 of the plasma-processing apparatus having the configuration shown in FIG. 20, the region at which the solid source 20e is disposed is located so as to overlap the second electrode E2 and the third electrode E3. Furthermore, the solid source 20e is positioned so as to cover the second electrode E2 and the third electrode E3 when viewed from the direction from the first electrode 12 to the upper lid 13. In the chamber 11, the solid source 20e is provided separately from the upper lid 13 of the chamber 11.

With this configuration, the solid source 20e (20) of the plasma-processing apparatus shown in FIG. 20 is preferentially sputtered by the plasma P2 (low-frequency plasma) generated due to the second electrode E2. Accordingly, the oxygen element is supplied to the silicon substrate S serving as a target object such that the oxygen element increases in the radial direction of the silicon substrate S.

Therefore, even in the plasma-processing apparatus shown in FIG. 20, similar to the plasma-processing apparatus shown in FIG. 19, the shape of the side surface of the recess formed on the silicon substrate S is maintained in a substantially straight shape in the depth direction of the recess on the entire area of the silicon substrate S such as both the center region and the outer-periphery region of the silicon substrate.

Hereinbelow, a silicon dry etching method according to a sixth embodiment of the invention will be described with reference to the drawings.

Figure 21:
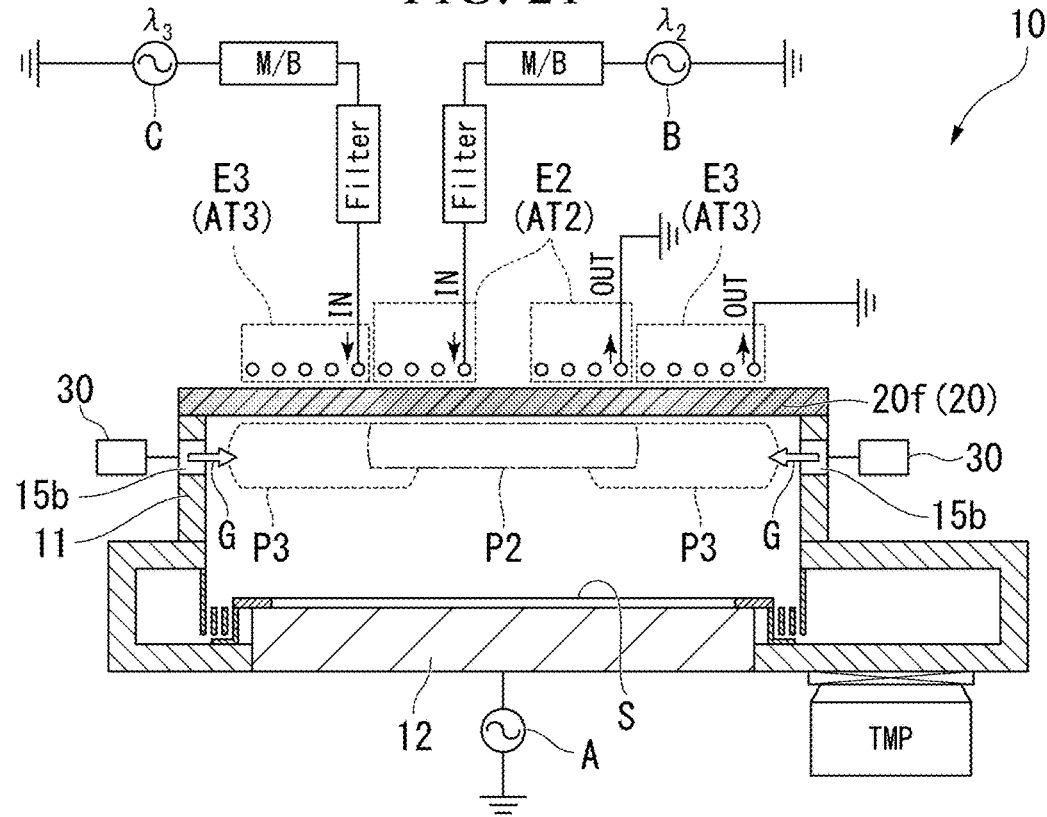
FIG. 21 is a manufacturing apparatus used in a silicon dry etching method according to a sixth embodiment of the invention.

FIG. 21 is a schematic cross-sectional view showing a plasma-processing apparatus that carries out a process in the embodiment. The embodiment is different from the above-described fifth embodiment in the upper lid connected to the chamber 11. Identical reference numerals are used for the elements which correspond to those of the above-described first embodiment, and the explanations thereof are omitted.

In the plasma-processing apparatus 10 according to the embodiment, as shown in FIG. 21, the upper lid connected to the chamber 11 in the chamber is formed of a solid source 20f (20).

Consequently, in the plasma-processing apparatus 10 shown in FIG. 21 it is possible to obtain the same actions and effects as those of the plasma-processing apparatus 10 shown in FIG. 20.

In addition to this, in the plasma-processing apparatus 10 shown in FIG. 21, the upper lid connected to the chamber 11 functions as a solid source. Consequently, a structure for holding a solid source in the chamber is not necessary. Moreover, since the upper lid connected to the chamber 11 is formed of a solid source, in a state in which the plasmas P2 and P3 generated inside the chamber are electrically discharged can be further stabilized.

Therefore, even in the plasma-processing apparatus shown in FIG. 21, similar to the plasma-processing apparatus shown in FIG. 20, the shape of the side surface of the recess formed on the substrate is maintained in a substantially straight shape in the depth direction of the recess on the entire area of the silicon substrate S such as both the center region and the outer-periphery region of the silicon substrate.

EXAMPLES

Hereinbelow, Examples according to the invention will be described.

Here, specific examples such as evaluation tests of the silicon etching method according to the invention will be described.

Experimental Example 1

As described above, the recess patterns VS and VL were formed on the silicon substrate S using the plasma-processing apparatus 10 shown in FIG. 17.

Here, a via hole which serves as the recess pattern VS and has a diameter φS of 3 μm and a depth of 26 μm was formed. A via hole which serves as the recess pattern VL and has a diameter φL of 5 μm and a depth of 26 μm was formed. At this time, the deposition step S05, the dry-etching step S06, and the ashing step S07 serve as one process cycle, and the process cycle was repetitively carried out thirty times (30 cycles).

First step: the deposition step S05 of forming a thin film including carbon

Second step: the dry etching step S06 of using the thin film including carbon as a mask and forming a TSV bottom portion of the insulating layer.

Third step: the ashing step S07 of removing the thin film including carbon.

Fourth step: a step of forming a through-hole electrode.

The conditions of forming the via hole are as follows.

In the plasma-processing apparatus 10 shown in FIG. 17, the diameter D (mm) of the first electrode 12 serving as the support part (substrate stage) supporting the silicon substrate S was 400 mm, and the diameter d (mm) of the second electrode (antenna AT2) was 400 mm.

The conditions of the deposition step S05 are as follows.

Figure 22:
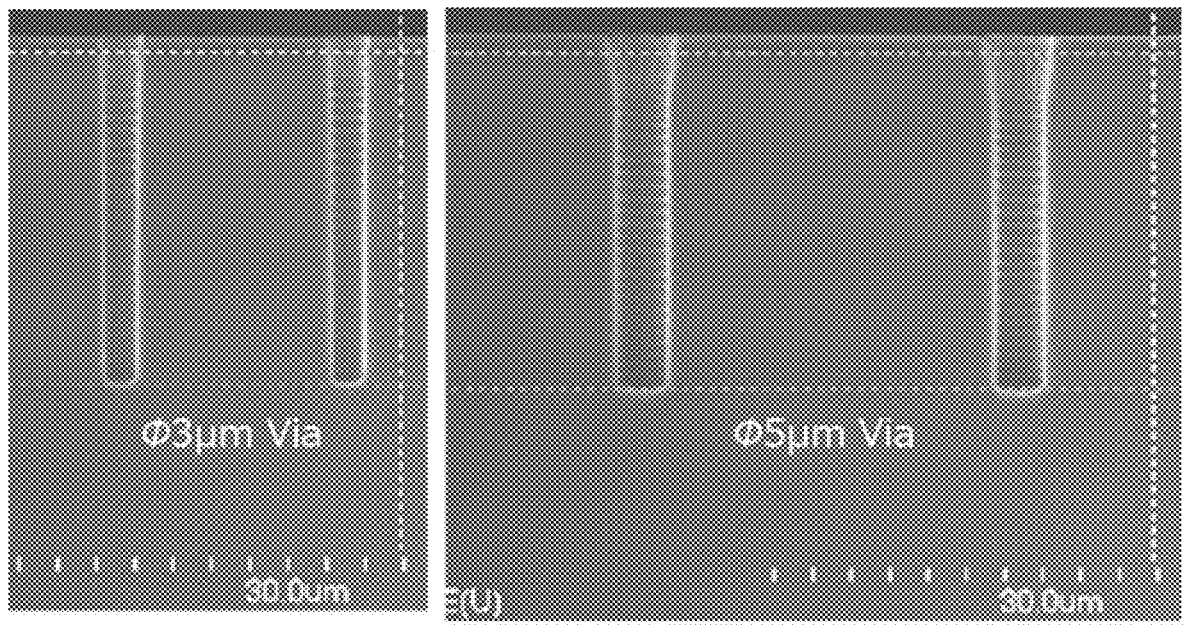
FIG. 22 is a view showing a silicon dry etching method according to Example of the invention.

Supply gas: $C_4F_8$
Gas flow rate: $C_4F_8$ of 200 sccm
Processing ambient pressure: 9 Pa
Supply power of second electrode E2: 1500 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 0 W The conditions of the dry-etching step S06 are as follows.
Supply gas: $SF_8$, $O_2$, and $SiF_4$
Gas flow rate: $SF_8$ of 275 sccm, $O_2$ of 60 sccm, and $SiF_4$ of 30 sccm
Processing ambient pressure: 9 Pa
Supply power of second electrode E2: 2000 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 100 to 200 W
Frequency $\lambda 1$ of bias power: 400 kHz The conditions of the ashing step S07 are as follows.
Supply gas: $O_2$
Gas flow rate: $O_2$ of 450 sccm
Processing ambient pressure: 9 Pa
Supply power of second electrode E2: 2000 W
Frequency $\lambda 2$ of supply power of second electrode E2: 13.56 MHz
Supply power of third electrode E3: 2000 W
Frequency $\lambda 3$ of supply power of third electrode E3: 2 MHz
Bias power: 200 W
Frequency $\lambda 1$ of bias power: 400 kHz FIG. 22 shows a SEM image obtained by image-capturing a cross section of the recess patterns VS and VL formed in accordance with the aforementioned conditions.

Experimental Example 2

Similar to Experimental Example 1, the deposition step S05 and the dry-etching step S06 were repetitively carried out. A via hole which serves as the recess pattern VS and has a diameter φS of 3 μm and a depth of 24 μm was formed. A via hole which serves as the recess pattern VL and has a diameter φL of 5 μm and a depth of 30 μm was formed. At this time, the ashing step S07 was not carried out.

Figure 23:
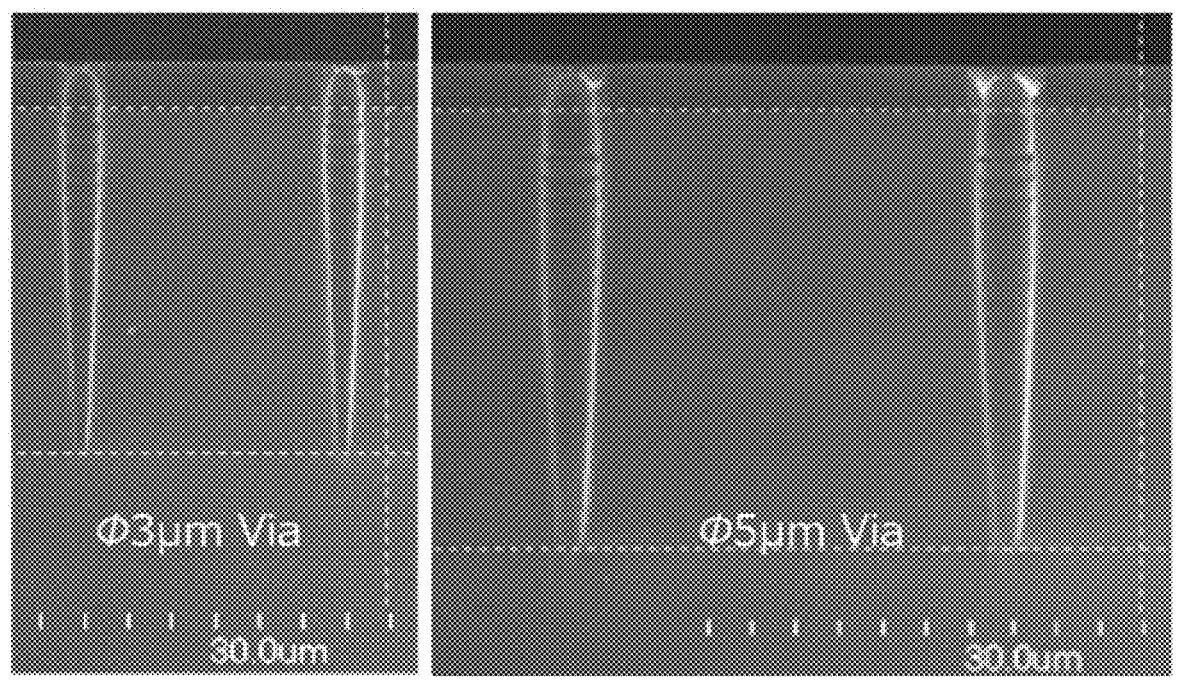
FIG. 23 is a view showing a silicon dry etching method according to Example of the invention.

FIG. 23 shows a SEM image obtained by image-capturing a cross section of the recess patterns VS and VL formed in accordance with the aforementioned conditions.

From the results showing Experimental Examples 1 and 2 shown in FIGS. 22 and 23, it was found that as the ashing step S07 is carried out for each cycle, a tapered shape is not generated in the recess patterns VS and VL, and the recess patterns VS and VL can be formed so as to have a side wall vertical to the silicon substrate S.

Next, a change in anisotropy of the dry-etching step S06 was evaluated.

Experimental Example 3

Although conditions similar to Experimental Example 1 were adopted, the deposition step S05 and the dry-etching step S06 serve as one process cycle, the process cycle was not carried out, and a via hole having the recess pattern VS such that φS thereof is 5 μm and the depth thereof is 25 μm was formed.

The processing conditions at this time are as follows.
Frequency $\lambda 2$ of supply power of second electrode E2: 13.56 MHz
Frequency $\lambda 3$ of supply power of third electrode E3: 2 MHz The processing using dual frequency ICP in accordance with the processing conditions was carried out.

Figure 24:
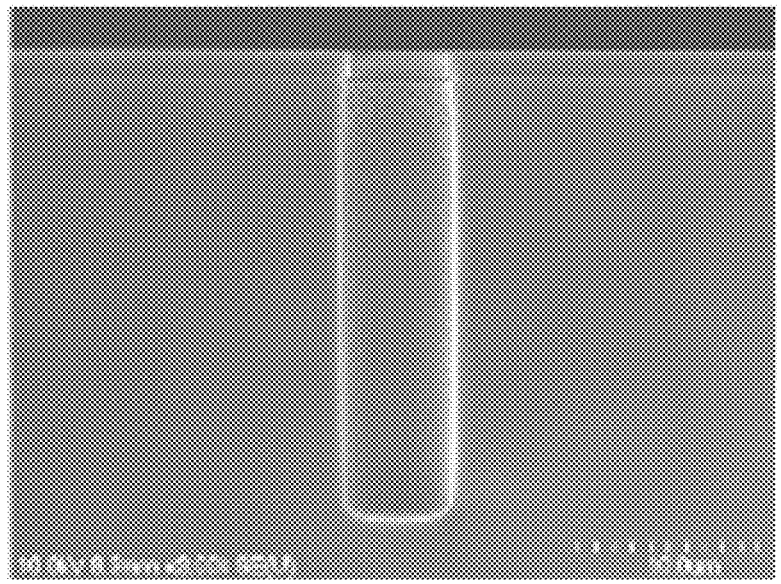
FIG. 24 is a view showing a silicon dry etching method according to Example of the invention.

FIG. 24 shows a SEM image obtained by image-capturing a cross section of the recess pattern VS formed as mentioned above.

Experimental Example 4

Although conditions similar to Experimental Example 1 were adopted, the deposition step S05 and the dry-etching step S06 serve as one process cycle, the process cycle was not carried out, and a via hole having the recess pattern VS such that φS thereof is 5 μm and the depth thereof is 15 μm was formed.

The processing conditions at this time are as follows.
Frequency $\lambda 2$ of supply power of second electrode E2: 13.56 MHz
Frequency $\lambda 3$ of supply power of third electrode E3: OFF The processing using Single frequency ICP in accordance with the processing conditions was carried out.

Figure 25:
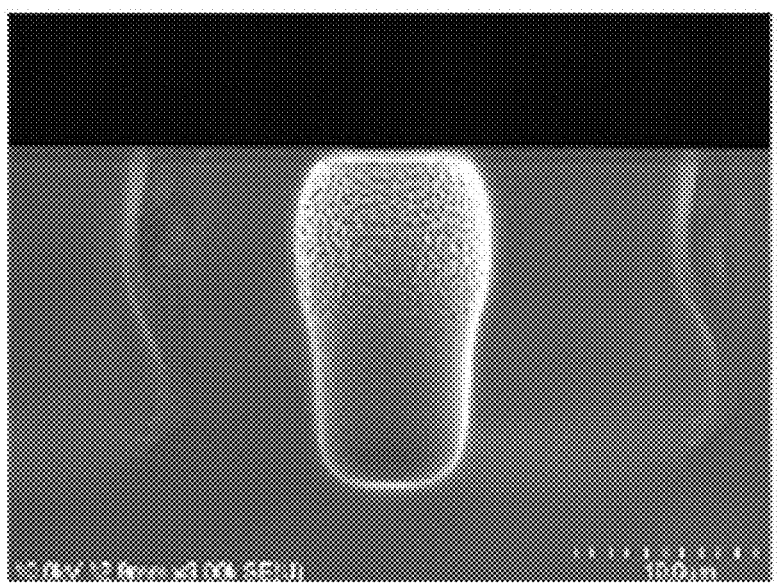
FIG. 25 is a view showing a silicon dry etching method according to Example of the invention.

FIG. 25 shows a SEM image obtained by image-capturing a cross section of the recess pattern VS formed as mentioned above.

From the results shown in FIGS. 24 and 25, it was found that as the dual frequency ICP is carried out, the opening of the mask layer is prevented from being occluded, deformation in shape (tapered shape) of the recess portion is prevented, and it is possible to ensure a high degree of anisotropy.

Next, deposition coverages (a state of film formation of a deposition layer) of the deposition step S05 regarding the following experimental examples were compared.

Experimental Example 5

Although conditions similar to Experimental Example 3 were adopted, the deposition step S05 and the dry-etching step S06 serve as one process cycle, the process cycle was not carried out, and a via hole having the recess pattern VS such that φS thereof is 5 μm and the depth thereof is 10 μm was formed.

The processing conditions at this time are as follows.
Frequency λ2 of supply power of second electrode E2: 13.56 MHz
Frequency λ3 of supply power of third electrode E3: 2 MHz The processing using dual frequency ICP in accordance with the processing conditions was carried out.

At the same time, the following processing conditions were adopted in order to adjust the deposition coverage.

Supply power of second electrode E2: 1500 W (13.56 MHz)
Supply power of third electrode E3: OFF (2 MHz)

The experiment of forming a deposition layer by the deposition step in accordance with the processing conditions was carried out.

Figure 26:
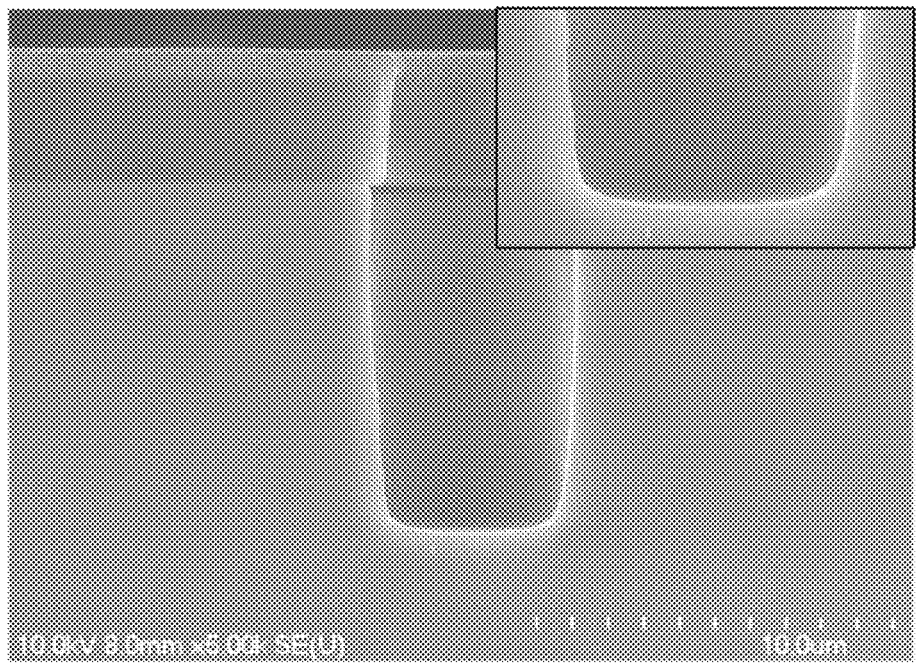
FIG. 26 is a view showing a silicon dry etching method according to Example of the invention.

FIG. 26 shows a SEM image obtained by image-capturing a cross section of the recess pattern VS formed as mentioned above.

Experimental Example 6

Although conditions similar to Experimental Example 1 were adopted, the deposition step S05 and the dry-etching step S06 serve as one process cycle, the process cycle was not carried out, and a via hole having the recess pattern VS such that φS thereof is 5 μm and the depth thereof is 10 μm was formed.

The processing conditions at this time are as follows.
Frequency λ2 of supply power of second electrode E2: 13.56 MHz
Frequency λ3 of supply power of third electrode E3: 2 MHz The processing using dual frequency ICP in accordance with the processing conditions was carried out.

At the same time, the following processing conditions were adopted in order to adjust the deposition coverage.

Supply power of second electrode E2: 1500 W (13.56 MHz)
Supply power of third electrode E3: 2000 W (2 MHz)

The experiment of forming a deposition layer by the deposition step in accordance with the processing conditions was carried out.

Figure 27:
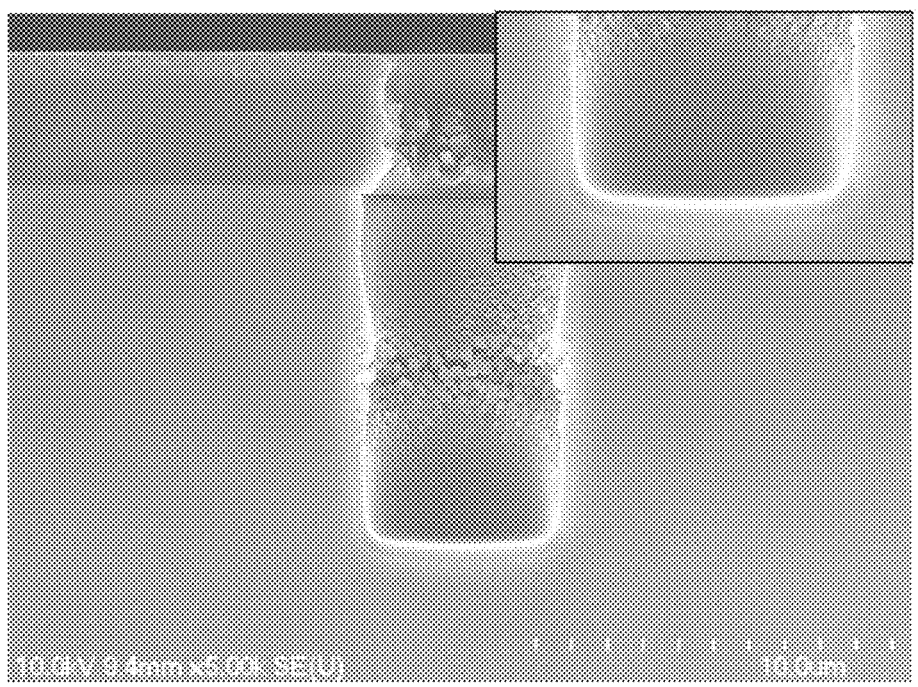
FIG. 27 is a view showing a silicon dry etching method according to Example of the invention.

FIG. 27 shows a SEM image obtained by image-capturing a cross section of the recess pattern VS formed as mentioned above.

From the results shown in FIGS. 26 and 27, it was found that the coverage can be controlled by the dual frequency ICP such that the deposition amount of the deposition layer increases on the bottom portion of the via hole.

Particularly, the portion at which the deposition layer is desirable to be deposited in order to reduce the RIE-lag is the bottom portion of the via hole. Accordingly, it was found that the above results contribute to shortening of the processing time. Moreover, it is seen that deposition coverage can be controlled in accordance with the etching depth and the aspect ratio by controlling the power of the dual frequency ICP.

From the above-mentioned results, it is important to set the processing conditions as follows.

A silicon dry etching process method repetitively carries out three steps in total of: carrying out a $C_xF_y$ deposition-step; carrying out an etching-step after the deposition-step; and carrying out a deposition-ashing step after the etching-step, and therefore causes the RIE-lag not to be generated.

A silicon dry etching process method carries out a repetitive process including three steps in total of: carrying out a $C_xF_y$ deposition-step; carrying out an etching-step after the deposition-step; and carrying out a deposition-ashing step after the etching-step in the same processing chamber.

The mask layer is formed of a hard mask ($SiO_2$, SiN, metal, or the like) which is not removed by $O_2$ plasma.

In the deposition step, a deposition layer is formed by $C_4F_8$ electric discharge.

The process using the dual frequency ICP is carried out under the condition in which the frequency λ2 set to 13.65 MHz and the frequency λ3 is set to 2 MHz, the deposition coverage thereby is optimized, and the deposition layer is reliably formed on the bottom portion of the via hole for a shorter period of time.

It is thought that the deposition coverage is controlled in accordance with the etching depth and the aspect ratio by controlling the power of the dual frequency ICP under the condition in which the frequency λ2 set to 13.65 MHz and the frequency λ3 is set to 2 MHz.

In the etching step, the etching is carried out by $SF_6$-based electric discharge. In the etching step, a $SiO_x$ film is adhered to the surface of the side wall of the recess portion by adding the $O_2$ gas to the etching gas, and a state in which the side wall is protected (anisotropy) is maintained.

It is also conceivable that $SiF_4$ be added to the etching gas in the etching step.

Formation of the $SiO_x$ protective film is achieved by carrying out the dual frequency ICP under the condition in which the frequency λ2 set to 13.65 MHz and the frequency λ3 is set to 2 MHz.

The deposition-ashing step is a step of preventing the opening of the mask layer from being occluded by the deposition layer. In the deposition-ashing step, the deposition layer is removed by carrying out $O_2$ electric discharge.

The silicon dry etching method according to the embodiment of the invention utilizes the etching stop effect due to formation of the deposition layer. Consequently, the difference in depth of the recess pattern is suppressed after the recess patterns (a hole, a trench, or the like) having sizes different from each other are formed on the silicon substrate. A process cycle such that the deposition-ashing step is carried out after the formation of the deposition layer and the etching are carried out is carried out. Accordingly, the deposition layer is removed for each process cycle.

When the etching is carried out, although a $C_xF_y$-based polymer formed on the side walls of the recess patterns provided on the silicon substrate is also removed, since the dual frequency ICP (for example, the above-mentioned frequencies of 13.56 MHz and 2 MHz) is carried out in the etching step, the added $O_2$ gas is actively ionized. Therefore, the $SiO_x$ protective film is continuously formed.

Because of this, the overhanging of the deposition layer and the generation of a tapered shape due to the overhanging can be prevented. While maintaining the vertical shapes of the side walls with respect to the substrate surface of the silicon substrate S, the difference between the depths of the recess patterns (a hole, a trench, or the like) having the diameters different from each other can be suppressed from being generated after the etching treatment is carried out. According to the invention, after the etching treatment is carried out, it is possible to reduce the difference between the depths of the recess patterns having sizes different from each other (a hole, a trench, or the like).

What is claimed is:

1. A silicon dry etching method, comprising:
   preparing a silicon substrate;
   forming a mask pattern having an opening pattern on the silicon substrate;
   carrying out a deposition process of forming a deposition layer on the silicon substrate in accordance with the mask pattern while introducing a first gas;
   carrying out a dry etching process with respect to the silicon substrate in accordance with the mask pattern while introducing a second gas, and thereby forming a recess pattern on a surface of the silicon substrate; and
   carrying out an ashing process with respect to the silicon substrate while introducing a third gas, wherein
   an adhering product made of the same material as that of the deposition layer adhered to an inner edge of the opening pattern of the mask pattern is removed in the ashing process,
   the ashing process is carried out after the dry etching process,
   the deposition process and the dry etching process are repetitively carried out,
   the ashing process is carried out before the deposition process, and
   the silicon dry etching method forms recess patterns having aspect ratios different from each other on the surface of the silicon substrate without a difference in etching rate.

2. The silicon dry etching method according to claim 1, wherein
   the ashing process, the deposition process and the dry etching process are carried out in the same chamber.

3. The silicon dry etching method according to claim 1, wherein
   the third gas used in the ashing process includes an oxygen gas.

4. The silicon dry etching method according to claim 3, wherein
   the mask pattern is a mask pattern formed of a hard mask not removed by the ashing process.

5. The silicon dry etching method according to claim 1, wherein
   the first gas used in the deposition process includes fluorocarbon.

6. The silicon dry etching method according to claim 1, wherein
   the second gas used in the dry etching process includes sulfur fluoride.

7. The silicon dry etching method according to claim 6, wherein
   the second gas used in the dry etching process includes at least one selected from the group consisting of oxygen and silicon fluoride.

8. The silicon dry etching method according to claim 1, wherein
   anisotropic plasma processing having anisotropy in a direction in which the recess pattern is formed is carried out on the surface of the silicon substrate in the dry etching process, the ashing process, and the deposition process.

9. The silicon dry etching method according to claim 8, wherein
   the anisotropic plasma processing is carried out by generating inductively-coupled plasma by applying alternating voltages of frequencies different from each other for a center region and a peripheral edge region of the surface of the silicon substrate to electrodes disposed to face the silicon substrate in the anisotropic plasma processing.

10. The silicon dry etching method according to claim 9, wherein
    a frequency of the alternating voltage applied to the peripheral edge region of the surface of the silicon substrate is set lower than a frequency of the alternating voltage applied to the center region of the surface of the silicon substrate in the anisotropic plasma processing.

11. The silicon dry etching method according to claim 9, wherein
    plasma generation power applied to the center region of the surface of the silicon substrate in the ashing process and the dry etching process is set lower than or equal to plasma generation power applied to the center region of the surface of the silicon substrate in the deposition process.

12. The silicon dry etching method according to claim 9, wherein
    plasma generation power applied to the center region of the surface of the silicon substrate is set lower than or equal to plasma generation power applied to the peripheral edge region of the surface of the silicon substrate in the deposition process, the ashing process, and the dry etching process.

13. The silicon dry etching method according to claim 9, wherein
    bias power is applied to the silicon substrate in the ashing process and the dry etching process, and
    the bias power applied to the silicon substrate in the dry etching process is set lower than or equal to the bias power applied to the silicon substrate in the ashing process.

14. The silicon dry etching method according to claim 9, wherein
    a pressure in an atmosphere in which the ashing process is carried out is set higher than or equal to a pressure in an atmosphere in which the deposition process is carried out.

15. The silicon dry etching method according to claim 9, wherein
    a pressure in an atmosphere in which the dry etching process is carried out is set higher than or equal to a pressure in an atmosphere in which the deposition process is carried out.

16. The silicon dry etching method according to claim 9, further comprising
    preparing a plasma-processing apparatus including:
    a chamber that includes an upper lid having a center region and carries out a plasma processing with respect to a target object in an internal space capable of reducing a pressure thereof;

a first electrode disposed in the chamber, the target object being to be mounted on the first electrode;

a first high-frequency power source that applies a bias voltage having a first frequency λ1 to the first electrode;

a spiral shaped second electrode disposed outside the chamber, is located at an opposite side of the first electrode with respect to the upper lid, and is disposed on the center region;

a spiral shaped third electrode disposed outside the chamber, is located at an opposite side of the first electrode with respect to the upper lid, and is disposed at an outer-periphery of the second electrode;

a second high-frequency power source that applies an alternating voltage having a second frequency λ2 to the second electrode;

a third high-frequency power source that applies an alternating voltage having a third frequency λ3 to the third electrode;

a gas introduction device that introduces a processing gas including fluorine into an inside of the chamber; and a solid source located between the upper lid and the first electrode in the chamber, is disposed close to the upper lid than the first electrode, and is used in sputtering, wherein when the anisotropic plasma processing is carried out, in the case in which the second frequency λ2 and the third frequency λ3 are in relationship of λ2>λ3, the gas introduction device is disposed at the center region of the upper lid.

17. The silicon dry etching method according to claim 1, wherein the recess patterns formed on the silicon substrate includes a first bottom portion and a second bottom portion, the mask pattern has a first opening pattern and a second opening pattern as the opening pattern, the first opening pattern has a large diameter, the second opening pattern has a small diameter smaller than that of the first opening pattern, the first bottom portion corresponds to the first opening pattern, the second bottom portion corresponds to the second opening pattern, and a film thickness of the deposition layer formed by the deposition process is controlled in accordance with an etching depth and an aspect ratio of the opening pattern of the mask pattern such that a film thickness of the deposition layer formed on the first bottom portion becomes larger than a film thickness of the deposition layer formed on the second bottom portion.

18. A silicon dry etching method, comprising:
preparing a silicon substrate;
forming a mask pattern having an opening pattern on the silicon substrate;

carrying out a deposition process of forming a deposition layer on the silicon substrate in accordance with the mask pattern while introducing a first gas;

carrying out a dry etching process with respect to the silicon substrate in accordance with the mask pattern while introducing a second gas, and thereby forming a recess pattern on a surface of the silicon substrate; and carrying out an ashing process with respect to the silicon substrate while introducing a third gas, wherein the third gas used in the ashing process includes an oxygen gas, anisotropic plasma processing having anisotropy in a direction in which the recess pattern is formed is carried out on the surface of the silicon substrate in the ashing process, the anisotropic plasma processing is carried out by generating inductively-coupled plasma by applying alternating voltages of frequencies different from each other for a center region and a peripheral edge region of the surface of the silicon substrate to electrodes disposed to face the silicon substrate in the anisotropic plasma processing, plasma generation power applied to the center region of the surface of the silicon substrate in the ashing process and the dry etching process is set lower than or equal to plasma generation power applied to the center region of the surface of the silicon substrate in the deposition process, and the silicon dry etching method forms recess patterns having aspect ratios different from each other on the surface of the silicon substrate without a difference in etching rate.

19. The silicon dry etching method according to claim 18, wherein the recess patterns formed on the silicon substrate includes a first bottom portion and a second bottom portion, the mask pattern has a first opening pattern and a second opening pattern as the opening pattern, the first opening pattern has a large diameter, the second opening pattern has a small diameter smaller than that of the first opening pattern, the first bottom portion corresponds to the first opening pattern, the second bottom portion corresponds to the second opening pattern, and a film thickness of the deposition layer formed by the deposition process is controlled in accordance with an etching depth and an aspect ratio of the opening pattern of the mask pattern such that a film thickness of the deposition layer formed on the first bottom portion becomes larger than a film thickness of the deposition layer formed on the second bottom portion.

* * * * *